(12) United States Patent
Liaw

(10) Patent No.: US 9,865,349 B2
(45) Date of Patent: Jan. 9, 2018

(54) MEMORY CELL

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 15/225,642

(22) Filed: Aug. 1, 2016

(65) Prior Publication Data

US 2016/0343437 A1 Nov. 24, 2016

Related U.S. Application Data

(60) Continuation of application No. 14/862,758, filed on Sep. 23, 2015, now Pat. No. 9,406,681, which is a division of application No. 14/152,666, filed on Jan. 10, 2014, now Pat. No. 9,183,933.

(51) Int. Cl.

| | |
|---|---|
| *G11C 15/04* | (2006.01) |
| *H01L 27/105* | (2006.01) |
| *H01L 23/528* | (2006.01) |
| *H01L 23/522* | (2006.01) |
| *H01L 27/02* | (2006.01) |
| *H01L 27/088* | (2006.01) |

(52) U.S. Cl.
CPC ............ *G11C 15/04* (2013.01); *H01L 23/528* (2013.01); *H01L 23/5226* (2013.01); *H01L 27/0207* (2013.01); *H01L 27/0886* (2013.01); *H01L 27/1052* (2013.01); *H01L 2924/0002* (2013.01)

(58) Field of Classification Search
CPC ... G11C 15/04; H01L 23/5226; H01L 23/528; H01L 27/0207; H01L 27/0886; H01L 27/1052; H01L 2924/0002
USPC .......................................................... 257/401
See application file for complete search history.

(56) References Cited

U.S. PATENT DOCUMENTS

| | | |
|---|---|---|
| 6,522,562 B2 | 2/2003 | Foss |
| 6,677,649 B2 | 1/2004 | Osada et al. |
| 8,461,627 B2 | 6/2013 | Byeon |

(Continued)

FOREIGN PATENT DOCUMENTS

| | | |
|---|---|---|
| JP | 2002373493 A | 12/2002 |
| KR | 20100068608 A | 6/2010 |

(Continued)

*Primary Examiner* — Yasser A Abdelaziez
(74) *Attorney, Agent, or Firm* — Slater Matsil, LLP

(57) ABSTRACT

Cell layouts for a memory cell, such as for ternary content addressable memory (TCAM), are disclosed. Some cell layouts include a well strap structure. A cell layout may include a p-doped well, an n-doped well, and a p-doped well sequentially along a layout. Another cell layout may include a p-doped well, an n-doped well, a p-doped well, and an n-doped well sequentially along a layout. A well strap structure may be in a p-doped well or an n-doped well. Various metallization layers having a mesh may be used with a memory cell layout. In some disclosed examples, a first metallization layer may have one, two, or four ground traces, and a second metallization layer may have two ground traces. These various ground traces may be electrically coupled together to form a mesh.

20 Claims, 19 Drawing Sheets

(56) References Cited

U.S. PATENT DOCUMENTS

| | | | |
|---|---|---|---|
| 8,582,352 B2 | 11/2013 | Liaw | |
| 2003/0185044 A1* | 10/2003 | Nii | G11C 8/16 365/154 |
| 2005/0124095 A1 | 6/2005 | Liaw | |
| 2007/0235765 A1 | 10/2007 | Liaw | |
| 2013/0135914 A1 | 5/2013 | Kohli | |
| 2013/0140640 A1* | 6/2013 | Do | H01L 27/04 257/368 |
| 2013/0141963 A1 | 6/2013 | Liaw | |
| 2013/0258759 A1* | 10/2013 | Liaw | G11C 11/412 365/154 |
| 2014/0327082 A1* | 11/2014 | Seshadri | H01L 27/1104 257/369 |

FOREIGN PATENT DOCUMENTS

| | | |
|---|---|---|
| KR | 100977760 B1 | 8/2010 |
| KR | 20130063439 A | 6/2013 |

* cited by examiner

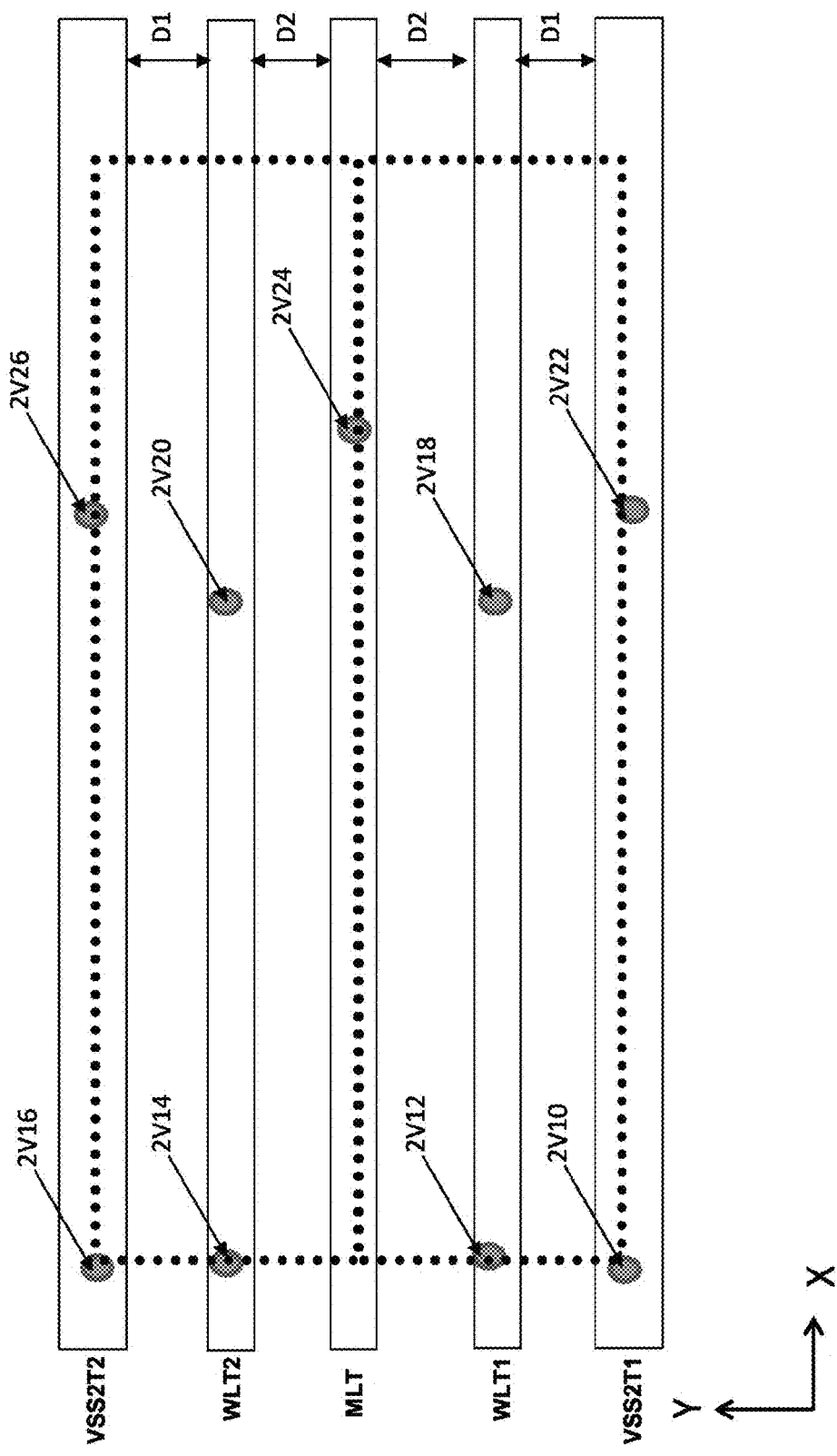

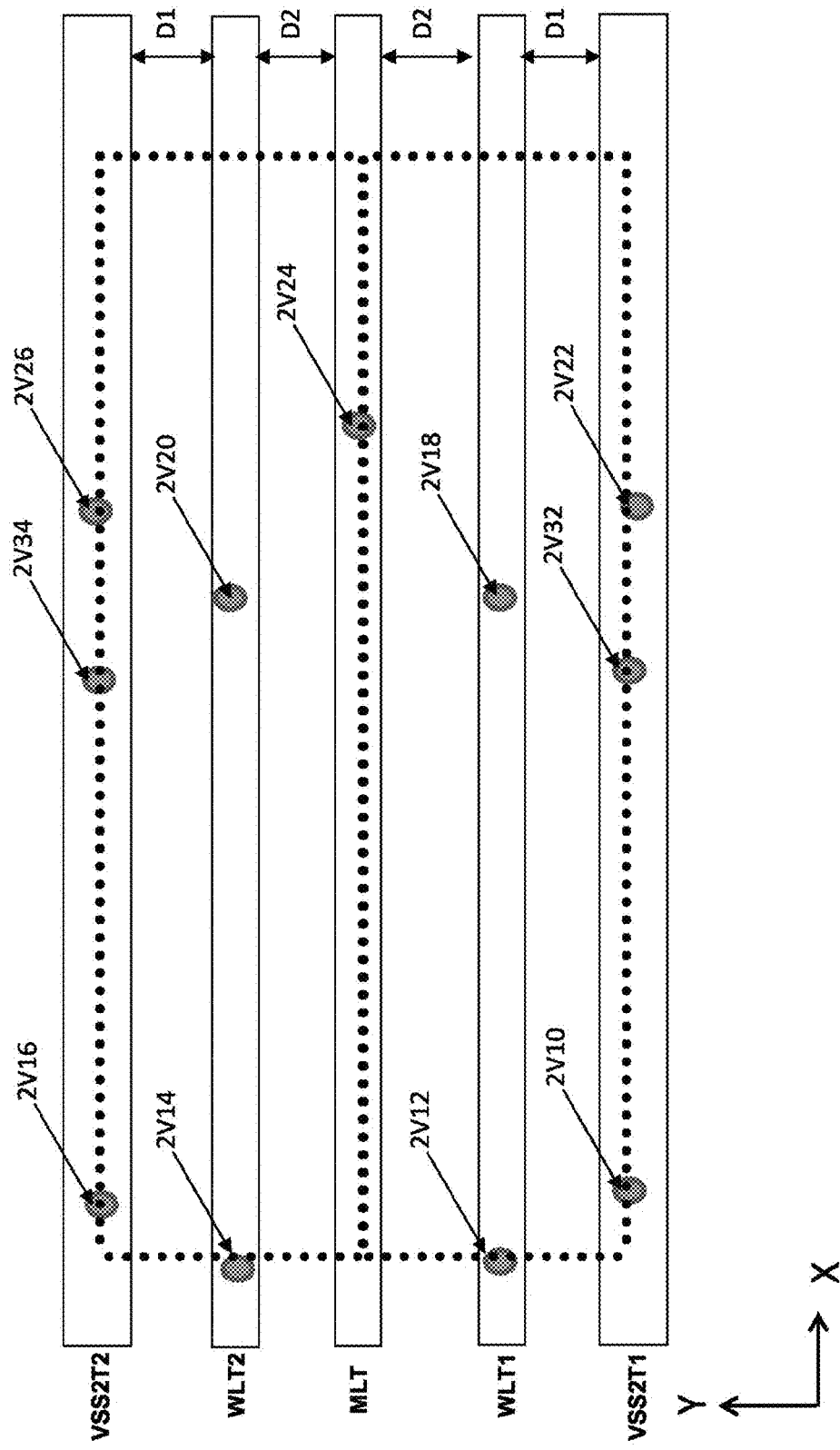

MEMORY CELL

This application is a continuation of U.S. patent application Ser. No. 14/862,758, filed on Sep. 23, 2015, entitled "Memory Cell," which is a divisional of U.S. patent application Ser. No. 14/152,666, filed on Jan. 10, 2014, entitled "Memory Cell," now U.S. Pat. No. 9,183,933, issued on Nov. 10, 2015, which applications are hereby incorporated herein by reference in their entirety.

BACKGROUND

Content addressable memories (CAMs) are widely used in applications, for example, where extremely fast search on a database is required, such as in networking, imaging, voice recognition, etc. For example, in network engines, CAMs are used to perform a fast search in the database, corresponding to the header field of any packet, and forward the packet to the corresponding matched address.

Since a very fast search may be required, search performance may be a critical performance parameter for CAMs. Also, the basic mechanism of search may be very power intensive, owing to a parallel nature of operation. Hence, it can be extremely important for a TCAM (Ternary CAM) design to have the best possible search performance along with having the least dynamic power expenditure for the search.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A and 11B illustrate a first metallization layer and via layer and a second metallization layer and via layer, respectively, according to another embodiment.

FIGS. 13A and 13B illustrate a first metallization layer and via layer and a second metallization layer and via layer, respectively, according to a still further embodiment.

DETAILED DESCRIPTION

Figure 1:
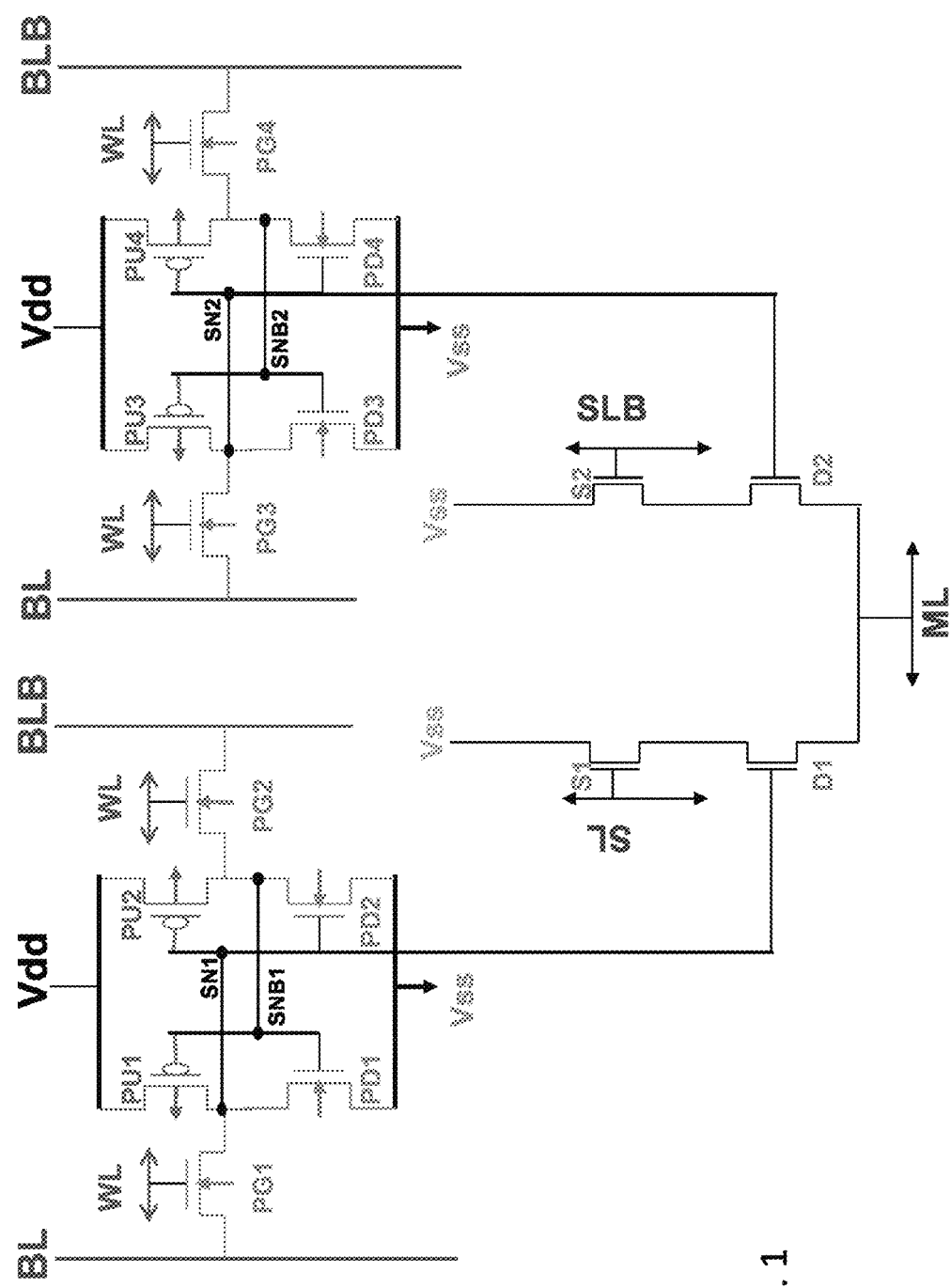
FIG. 1 is a circuit diagram of a first memory cell according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "above," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein will be described with respect to a specific context, namely a memory cell and array, and more particularly, a ternary content addressable memory (TCAM) cell and array. Various modifications are discussed with respect to embodiments; however, other modifications may be made to disclosed embodiments while remaining within the scope of the subject matter. A person of ordinary skill in the art will readily understand modifications that may be made.

FIG. 1 illustrates a circuit diagram of a first memory cell according to an embodiment. The cell includes pull-up transistors PU1, PU2 PU3, and PU4; pull-down transistors PD1, PD2, PD3, and PD4; pass-gate transistors PG1, PG2, PG3, and PG4; search gate transistors S1 and S2; and data gate transistors D1 and D2. As show in the circuit diagram, transistors PU1, PU2, PU3, and PU4 are p-type transistors, such as planar p-type field effect transistors (PFETs) or p-type fin field effect transistors (finFETs), and transistors PG1, PG2, PG3, PG4, PD1, PD2, PD3, PD4, S1, S2, D1, and D2 are n-type transistors, such as planar n-type field effect transistors (NFETs) or n-type finFETs.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vdd, and the sources of the pull-down transistors PD1 and PD2 are coupled to a ground voltage Vss.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

The drains of pull-up transistor PU3 and pull-down transistor PD3 are coupled together, and the drains of pull-up transistor PU4 and pull-down transistor PD4 are coupled together. Transistors PU3 and PD3 are cross-coupled with transistors PU4 and PD4 to form a second data latch. The gates of transistors PU4 and PD4 are coupled together and to the drains of transistors PU3 and PD3 to form a second storage node SN2, and the gates of transistors PU3 and PD3 are coupled together and to the drains of transistors PU4 and PD4 to form a complementary second storage node SNB2. Sources of the pull-up transistors PU3 and PU4 are coupled to power voltage Vdd, and the sources of the pull-down transistors PD3 and PD4 are coupled to a ground voltage Vss.

The second storage node SN2 of the second data latch is coupled to bit line BL through pass-gate transistor PG3, and the complementary second storage node SNB2 is coupled to complementary bit line BLB through pass-gate transistor PG4. The second storage node N2 and the complementary second storage node SNB2 are complementary nodes that are often at opposite logic levels (logic high or logic low). Gates of pass-gate transistors PG3 and PG4 are coupled to a word line WL.

Together, the first and second data latches form a storage port SP of the memory cell. A match port MP of the memory cell is cascaded from the storage port SP. A source of the search gate transistor S1 is coupled to a ground voltage Vss. A drain of the search gate transistor S1 is coupled to a source of the data gate transistor D1. A drain of the data gate transistor D1 is coupled to a match line ML. A gate of the search gate transistor S1 is coupled to a search line SL, and a gate of the data gate transistor D1 is coupled to the first storage node SN1. A source of the search gate transistor S2 is coupled to a ground voltage Vss. A drain of the search gate transistor S2 is coupled to a source of the data gate transistor D2. A drain of the data gate transistor D2 is coupled to the match line ML. A gate of the search gate transistor S2 is coupled to a complementary search line SLB, and a gate of the data gate transistor D2 is coupled to the second storage node SN2.

Figure 2:
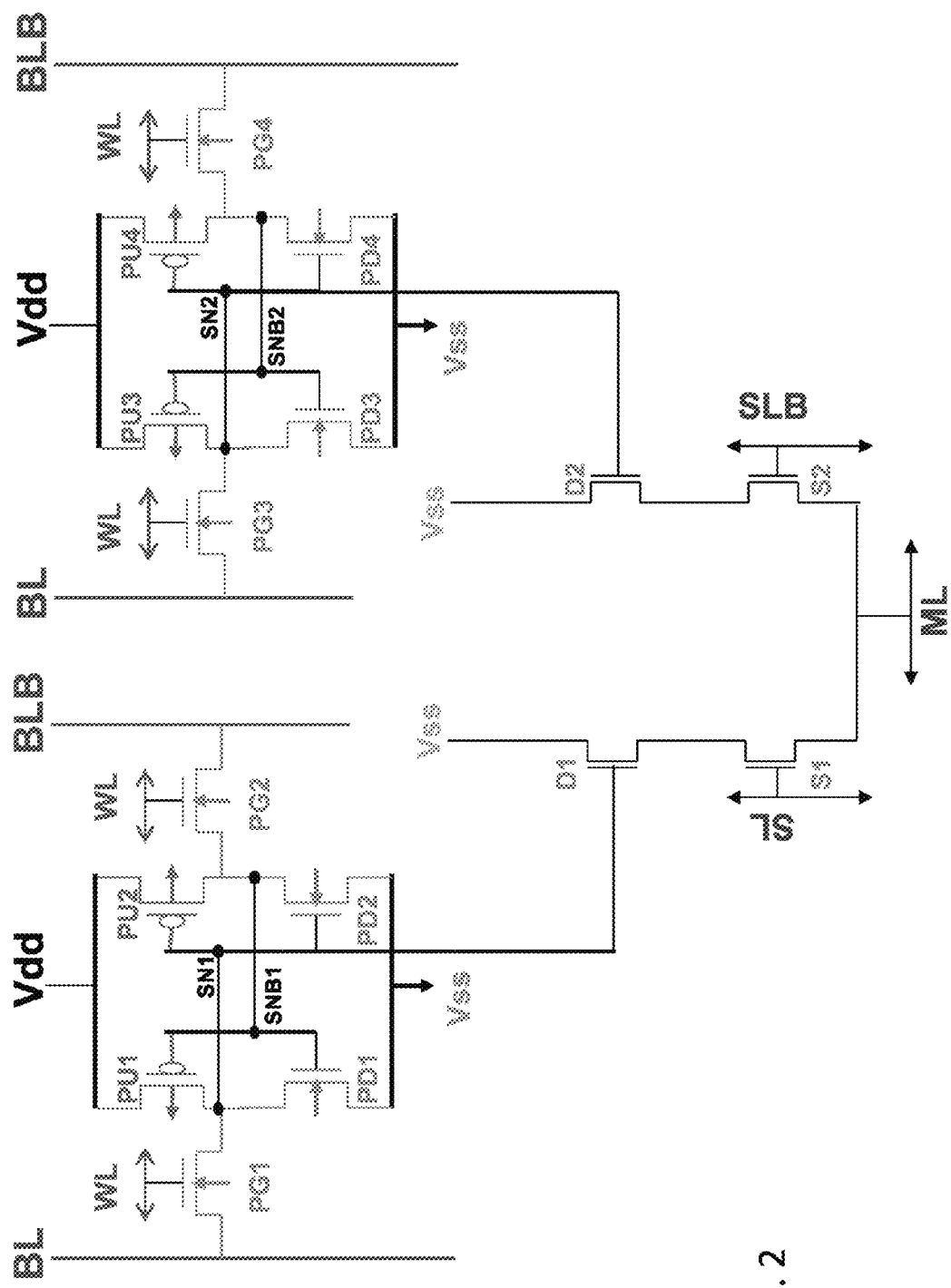
FIG. 2 is a circuit diagram of a second memory cell according to an embodiment.

FIG. 2 illustrates a circuit diagram of a second memory cell according to an embodiment. The storage port SP of the circuit diagram of FIG. 2 is configured in the same manner as the storage port SP of the circuit diagram of FIG. 1. A match port MP of the memory cell is cascaded from the storage port SP. A source of the data gate transistor D1 is coupled to a ground voltage Vss. A drain of the data gate transistor D1 is coupled to a source of the search gate transistor S1. A drain of the search gate transistor S1 is coupled to a match line ML. A gate of the search gate transistor S1 is coupled to a search line SL, and a gate of the data gate transistor D1 is coupled to the first storage node SN1. A source of the data gate transistor D2 is coupled to a ground voltage Vss. A drain of the data gate transistor D2 is coupled to a source of the search gate transistor S2. A drain of the search gate transistor S2 is coupled to the match line ML. A gate of the search gate transistor S2 is coupled to a complementary search line SLB, and a gate of the data gate transistor D2 is coupled to the second storage node SN2.

Figure 3:
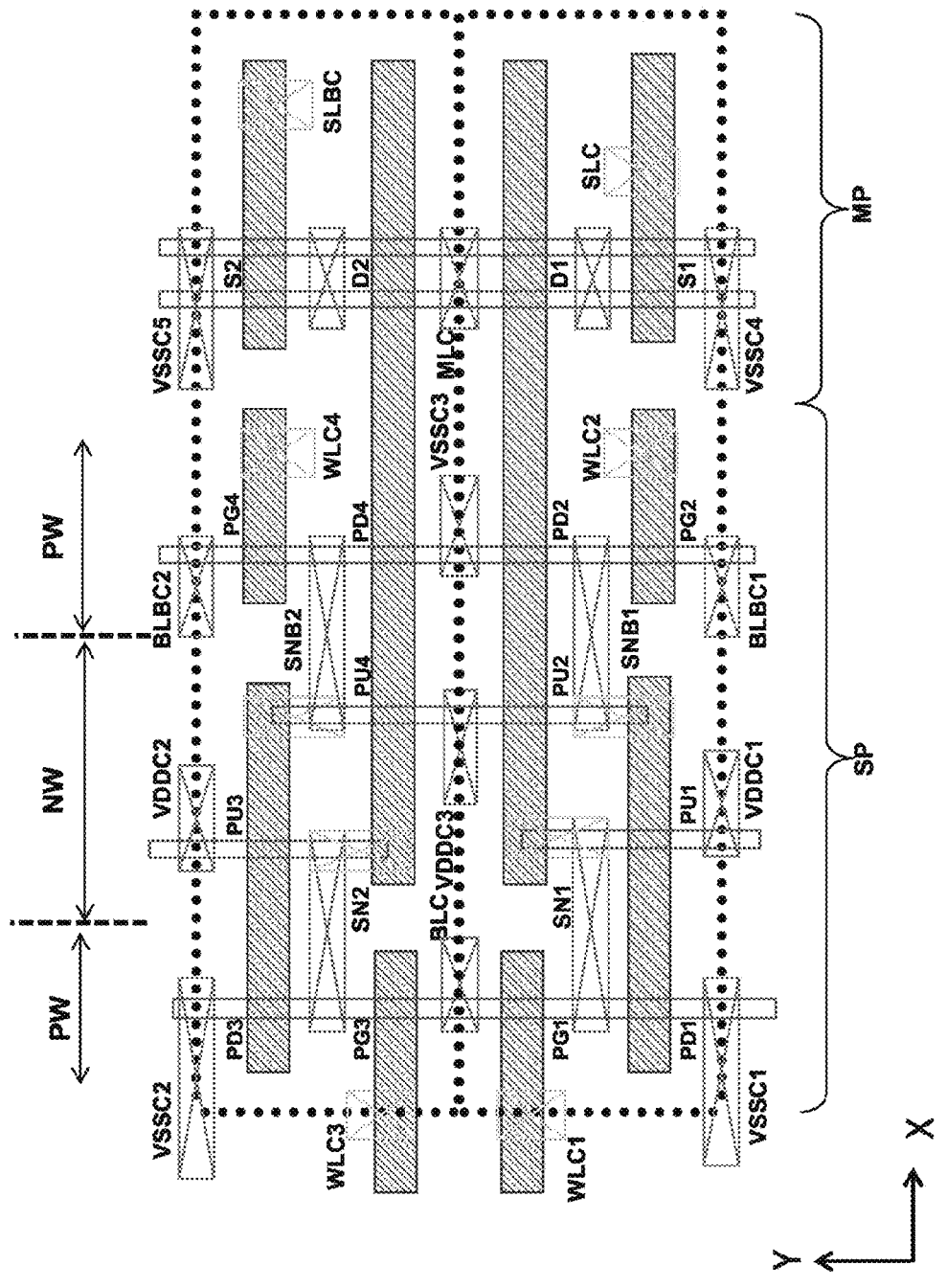
FIG. 3 is a first example cell layout for the cell in FIG. 1 according to an embodiment.

FIG. 3 illustrates a first example cell layout for the cell in FIG. 1 according to an embodiment. Although a layout is discussed corresponding to the cell in FIG. 1, a person of ordinary skill in the art will readily understand how to modify the layout in FIG. 3 to correspond to the cell in FIG. 2. FIG. 3 illustrates two dashed boxes, where each dashed box represents a data latch portion and corresponding cascaded device portion. The data latch portions of both boxes represent the storage port SP, and the cascaded device portions of both boxes represent the match port MP. The exterior boundaries of the dashed boxes represent boundaries of the cell. The cell may be mirrored around any Y-direction exterior boundary or mirrored or translated around any X-direction exterior boundary to form a layout comprising more cells, such as an array of cells.

FIG. 3 illustrates seven distinct active areas formed in and/or on a substrate, such as a semiconductor substrate like bulk silicon, that are respective portions of the transistors PU1, PU2 PU3, PU4, PD1, PD2, PD3, PD4, PG1, PG2, PG3, PG4, S1, S2, D1, and D2. In other embodiments, there may be more or less active areas, such as the example in FIG. 8 (discussed in detail below), which may be used to control a width of a transistor for current matching. The active areas in FIG. 3 extend in the Y-direction, which also corresponds to a direction of current flow of the transistors during operation. Active areas depicted as crossing a boundary of the cell layout (illustrated by exterior dashed lines) may be shared by transistors of adjacent cells. FIG. 3 further illustrates boundaries between p-doped wells PW and n-doped well NW. The respective boundaries extend in a Y-direction. N-type transistors, as discussed in FIG. 1, may be formed in the p-doped wells PW, and p-type transistors, as discussed in FIG. 1, may be formed in the n-doped wells NW. The active areas may be planar in the substrate to form planar FETs and/or may be fins in the substrate to form finFETs.

One active area forms the source, channel, and drain regions of each of the transistors PD1, PG1, PG3, and PD3. One active area forms the source, channel, and drain regions of the transistor PU1, and another one active area forms the source, channel, and drain regions of the transistor PU3. The active areas for the transistors PU1 and PU3 may be substantially aligned along longitudinal axes (e.g., in a Y-direction). One active area forms the source, channel, and drain regions of each of the transistors PU2 and PU4. One active area forms the source, channel, and drain regions of each of the transistors PG2, PD2, PD4, and PG4. Two active areas form the source, channel, and drain regions of each of the transistors S1, D1, D2, and S2. The formation process of the transistors S1, D1, D2, and S2 may differ from the formation process of the transistors PD1, PD2, PD3, PD4, PG1, PG2, PG3, and PG4, such that, for example, a threshold voltage of transistor PD2 is a higher than a threshold voltage of transistor D1, such as the difference being larger than 30 mV.

FIG. 3 further illustrates 10 distinct gate structures, which may include a gate dielectric with a conductive material, such as doped polysilicon, a metal, and/or silicide, thereover. As depicted in FIG. 3, the gate structures extend in the X-direction. Transistors PD1 and PU1 share a common gate structure over respective channel regions of the transistors PD1 and PUL Transistor PG1 has a gate structure over its channel region, and the gate structure may be shared by another transistor in an adjacent cell. Transistor PG3 has a gate structure over its channel region, and the gate structure may be shared by another transistor in an adjacent cell. Transistors PD3 and PU3 share a common gate structure over respective channel regions of the transistors PD3 and PU3. Transistors PU2, PD2, and D1 share a common gate structure over respective channel regions of the transistors PU2, PD2, and D1. Transistors PU4, PD4, and D2 share a common gate structure over respective channel regions of the transistors PU4, PD4, and D2. Transistor PG2 has a gate structure over its channel region, and transistor PG4 has a gate structure over its channel region. Transistor S1 has a gate structure over its channel region, and transistor S2 has a gate structure over its channel region.

FIG. 3 further illustrates various contacts formed to components in the cell. The contacts may be formed in a lower-most dielectric layer(s), such as an inter-layer dielectric (ILD), with a conductive material, such as a metal with or without a barrier layer. A first Vss contact VSSC1 is coupled to a source region of transistor PD1. A first Vdd contact VDDC1 is coupled to a source region of transistor PU1. A first complementary bit line contact BLBC1 is coupled to a source/drain region of transistor PG2. A fourth Vss contact VSSC4 is coupled to a source region of transistor S1 which may further electrically couple the two active areas of transistor S1. A first word line contact WLC1 is coupled to the gate structure of transistor PG1. A third word line contact WLC3 is coupled to the gate structure of transistor PG3. A second Vss contact VSSC2 is coupled to a source region of transistor PD3. A second Vdd contact VDDC2 is coupled to a source region of transistor PU3. A second complementary bit line contact BLBC2 is coupled to a source/drain region of transistor PG4. A fifth Vss contact VSSC5 is coupled to a source region of transistor S2, which may further electrically couple the two active areas of transistor S2. Each of the contacts VSSC1, VSSC2, VSSC4, VSSC5, VDDC1, VDDC2, BLBC1, BLBC2, WLC1, and WLC3 may be shared by one or more adjacent cells.

A bit line contact BLC is coupled to a source/drain region of transistors PG1 and PG3. A third Vdd contact VDDC3 is coupled to a source region of transistors PU2 and PU4. A third Vss contact VSSC3 is coupled to a source region of transistors PD2 and PD4. A second word line contact WL2 is coupled to a gate structure of transistor PG2. A fourth word line contact WLC4 is coupled to a gate structure of transistor PG4. A match line contact MLC is coupled to a drain region of transistors D1 and D2, which contact MLC also couples together the two active areas of transistors D1 and D2. A search line contact SLC is coupled to the gate structure of transistor S1. A complementary search line contact SLBC is coupled to the gate structure of transistor S2.

A first storage node contact SN1 couples together the drain of transistor PD1, a source/drain region of transistor PG1, the drain of transistor PU1, and the common gate structure for transistors PU2, PD2, and D1. The first storage node contact SN1 may comprise a butted contact between the active area of transistor PU1 and the common gate structure for transistors PU2, PD2, and D1. A first complementary storage node contact SNB1 couples together the drain of transistor PD2, a source/drain region of transistor PG2, the drain of transistor PU2, and the common gate structure for transistors PU1 and PD1. The first complementary storage node contact SNB1 may comprise a butted contact between the active area of transistor PU2 and the common gate structure for transistors PU1 and PD1. A second storage node contact SN2 couples together the drain of transistor PD3, a source/drain region of transistor PG3, the drain of transistor PU3, and the common gate structure for transistors PU4, PD4, and D2. The second storage node contact SN2 may comprise a butted contact between the active area of transistor PU3 and the common gate structure for transistors PU4, PD4, and D2. A second complementary storage node contact SNB2 couples together the drain of transistor PD4, a source/drain region of transistor PG4, the drain of transistor PU4, and the common gate structure for transistors PU3 and PD3. The second complementary storage node contact SNB2 may comprise a butted contact between the active area of transistor PU4 and the common gate structure for transistors PU3 and PD3. Respective contacts (unnumbered) couple active areas of transistors D1 and S1 together and of transistors S2 and D2 together.

Figure 4:
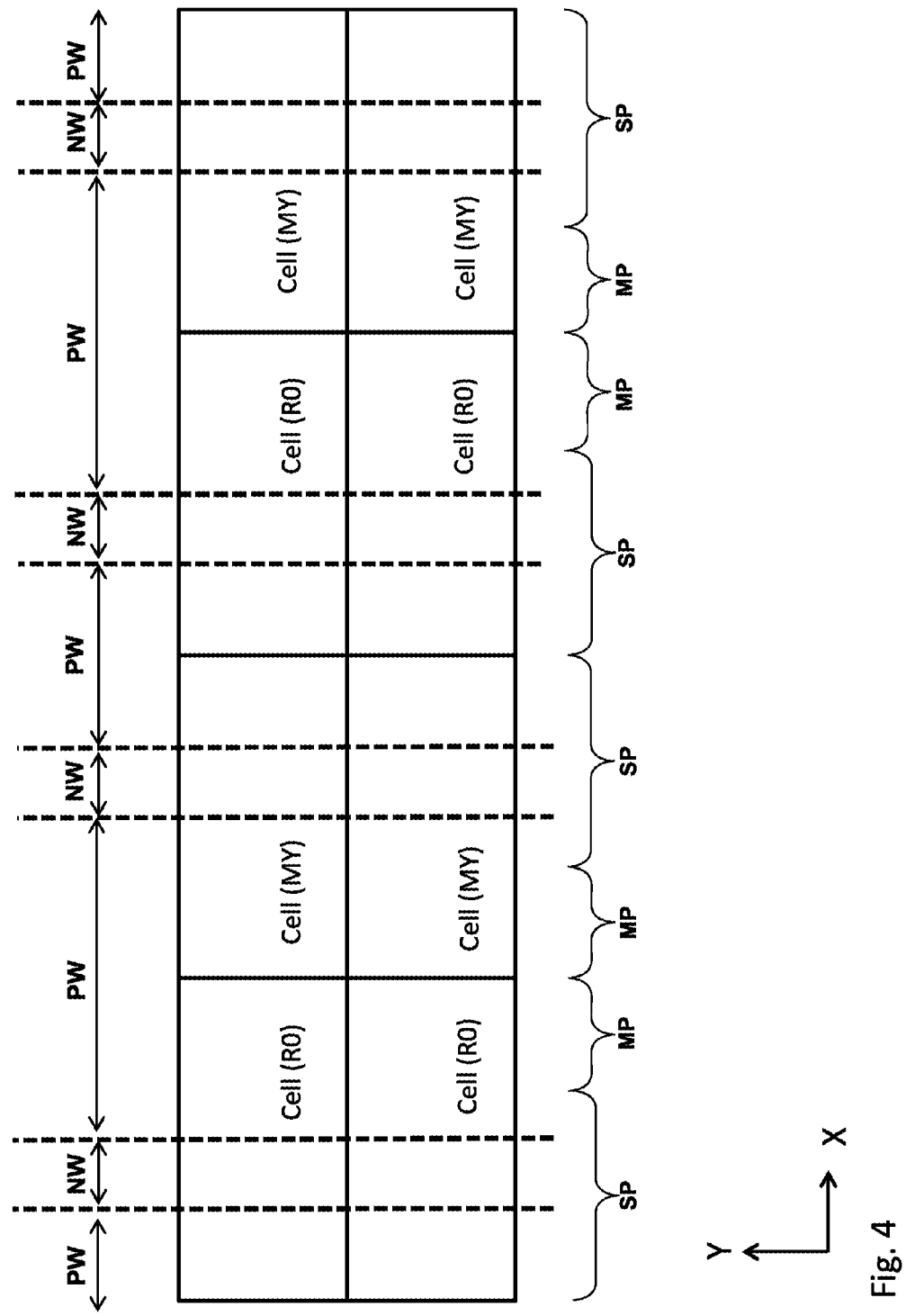
FIG. 4 is a 2×4 array of cells according to an embodiment.

FIG. 4 illustrates a 2×4 array of cells according to an embodiment. FIG. 4 illustrates an arrangement of p-doped wells PW and n-doped wells NW across multiple cells. Respective p-doped wells PW may extend in an X-direction (e.g., a row direction) across adjacent cells. Each of the n-doped wells NW and p-doped wells PW may extend in a Y-direction (e.g., column direction) across cells. FIG. 4 further illustrates corresponding storage ports SP and match ports MP among the cells, and illustrates how the cells may be mirrored along exterior boundaries. For example, cells may be mirrored in an X-direction (e.g., across a Y-direction cell boundary), which is indicated as mirror-across-Y MY. An original cell RO may be translated (or mirrored) in a Y-direction. Having wells PW and NW in this arrangement for each cell (e.g., PW-NW-PW) may increase a latch-up performance of the storage ports of the cells.

Figure 5:
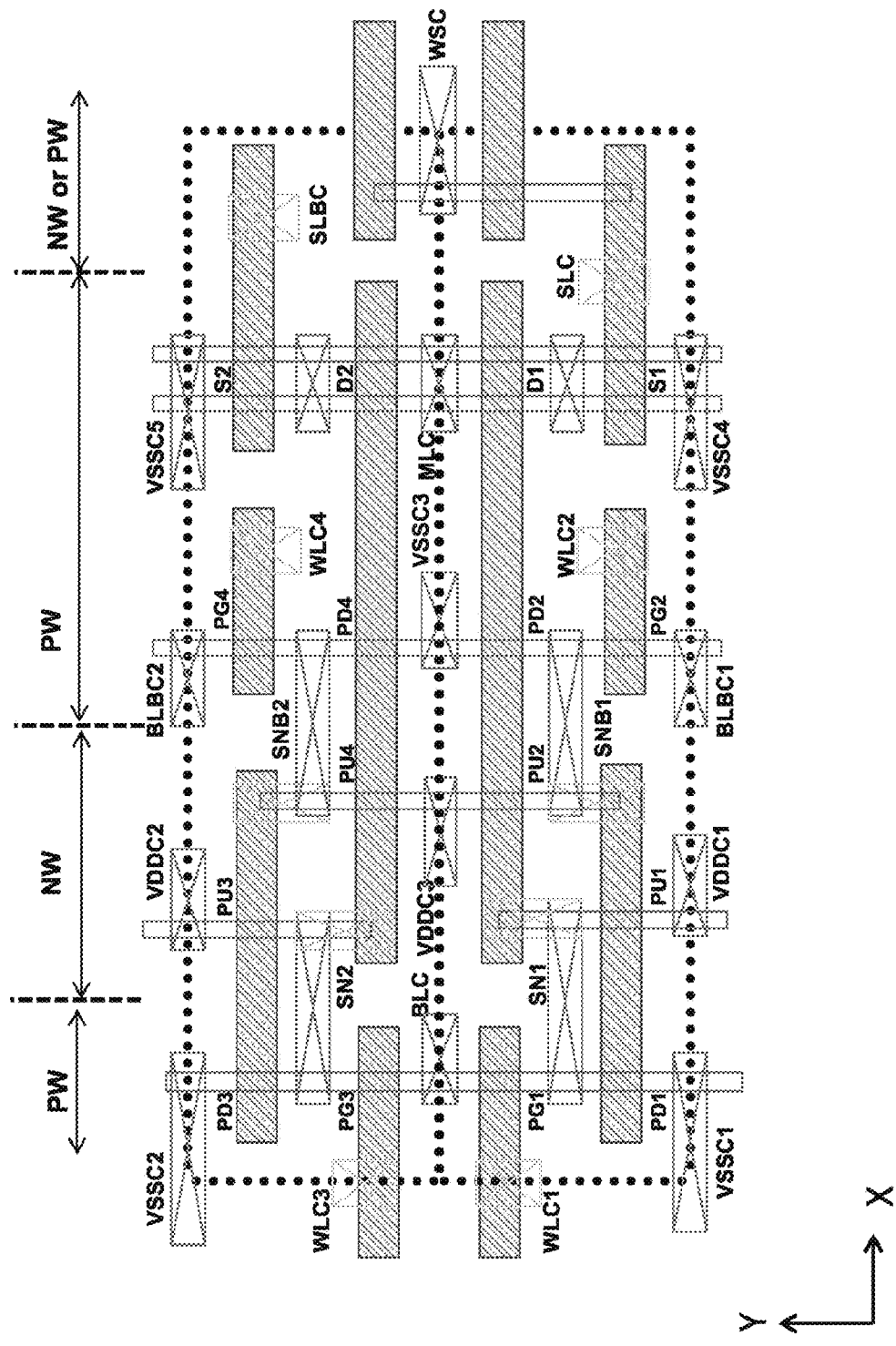
FIG. 5 is a second example cell layout for the cell in FIG. 1 according to an embodiment.

FIG. 5 illustrates a second example cell layout for the cell in FIG. 1 according to an embodiment. Although a layout is discussed corresponding to the cell in FIG. 1, a person of ordinary skill in the art will readily understand how to modify the layout in FIG. 5 to correspond to the cell in FIG. 2. The cell in FIG. 5 is a modification of the cell in FIG. 3. FIG. 5 further includes another active area extending in the Y-direction, two gate structures over the active area, and a well strap contact WSC coupled to the active area. The additional active area and two gate structures form components of a well strap structure WSS in this embodiment. The active area extends from under the gate structure of transistor S1. The active area may be formed in an n-doped well NW or a p-doped well PW. The two gate structures are disposed on opposite sides of the well strap contact WSC in the Y-direction. The two gate structures may be shared with an adjacent cell. The two gate structures may be dummy gates and may be floating. Dummy gates may be used to increase a layout uniformity and may increase critical dimension control. With the dummy gates, the active area of the well strap structure WSS may be doped like a transistor formed in a corresponding well. For example, if the active area is in a p-doped well PW, the active area may be doped to form n-type source/drain regions, and the well strap contact WSC may be electrically coupled to a ground. Further, if the active area is in an n-doped well NW, the active area may be doped to form p-type source/drain regions, and the well strap contact WSC may be electrically coupled to a high voltage, such as power Vdd.

Figure 6:
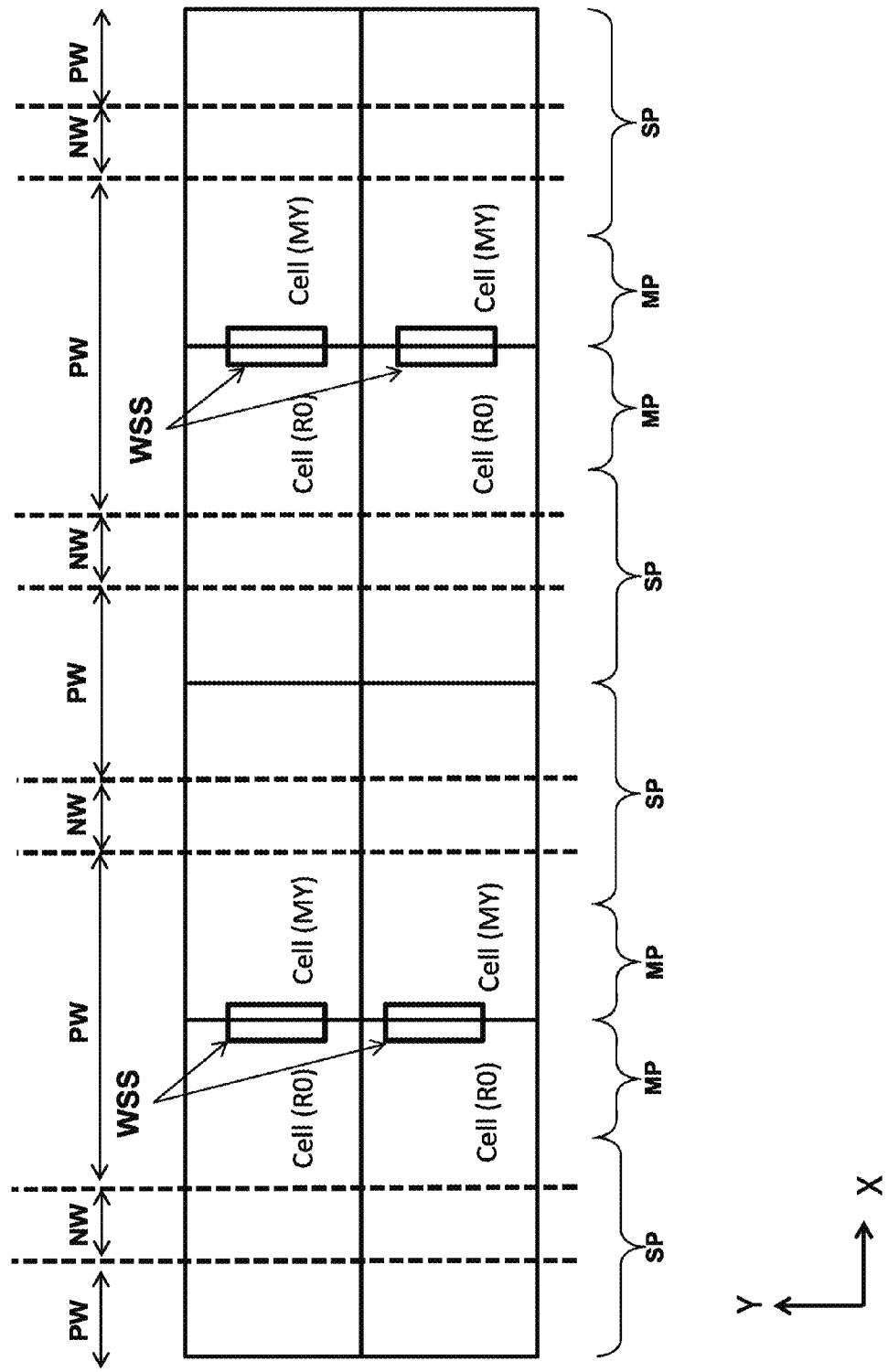
FIG. 6 is a 2×4 array of cells according to an embodiment.
Figure 7:
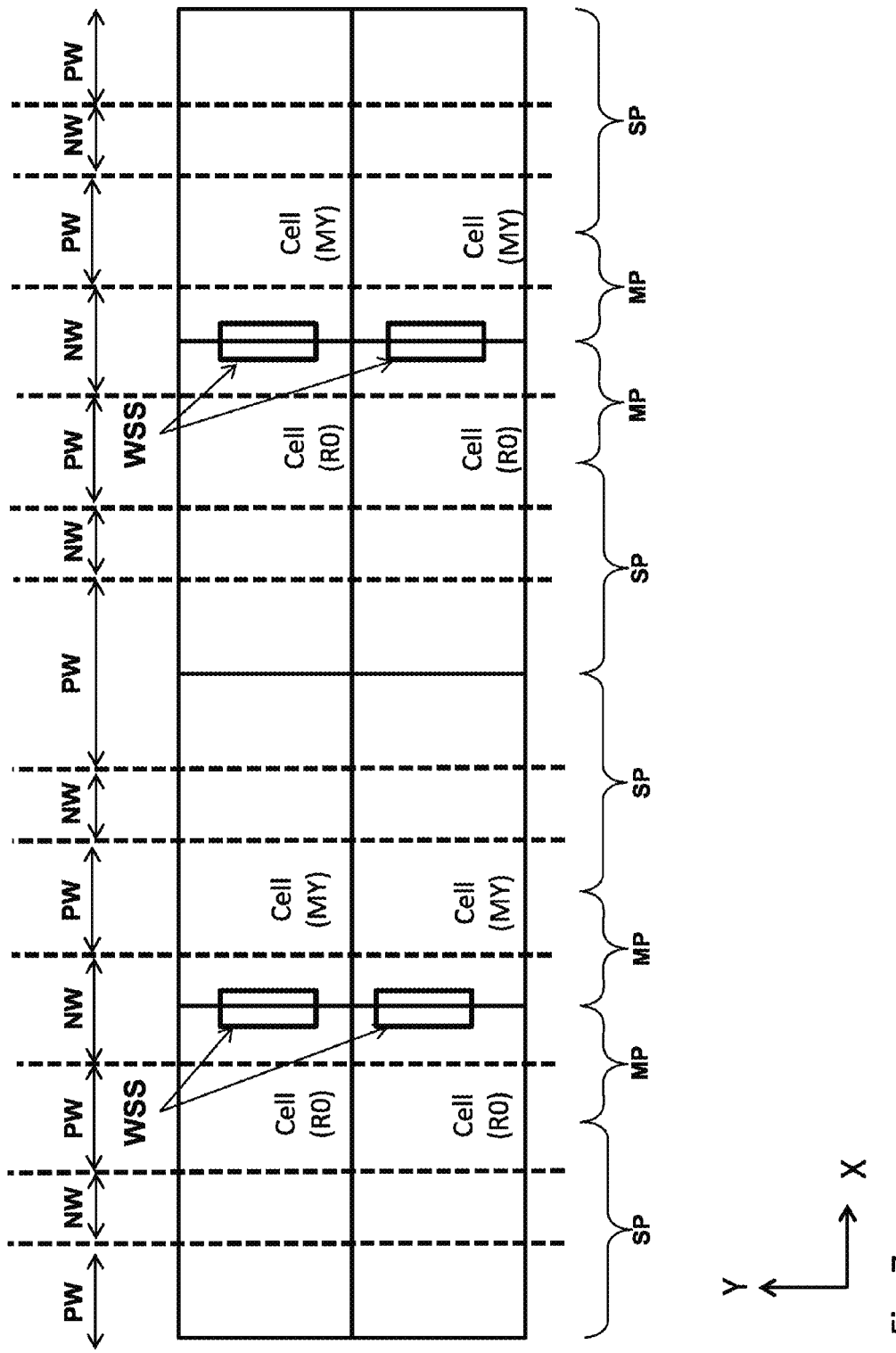
FIG. 7 is a 2×4 array of cells according to a further embodiment.

FIG. 6 illustrates a 2×4 array of cells according to an embodiment. FIG. 6 is a modification of FIG. 4 to include well strap structures WSS in each cell in respective p-doped wells PW. FIG. 7 is a further modification of FIG. 6 where the well strap structures WSS in each cell are formed in respective n-doped wells NW. In this example, the n-doped wells NW in which the well strap structures WSS are formed are shared across cells in an X-direction. Having wells PW and NW in this arrangement for each cell (e.g., NW-PW-NW-PW) may reduce carrier diffusion through the substrate and may also reduce a soft error rate (SER).

Figure 8:
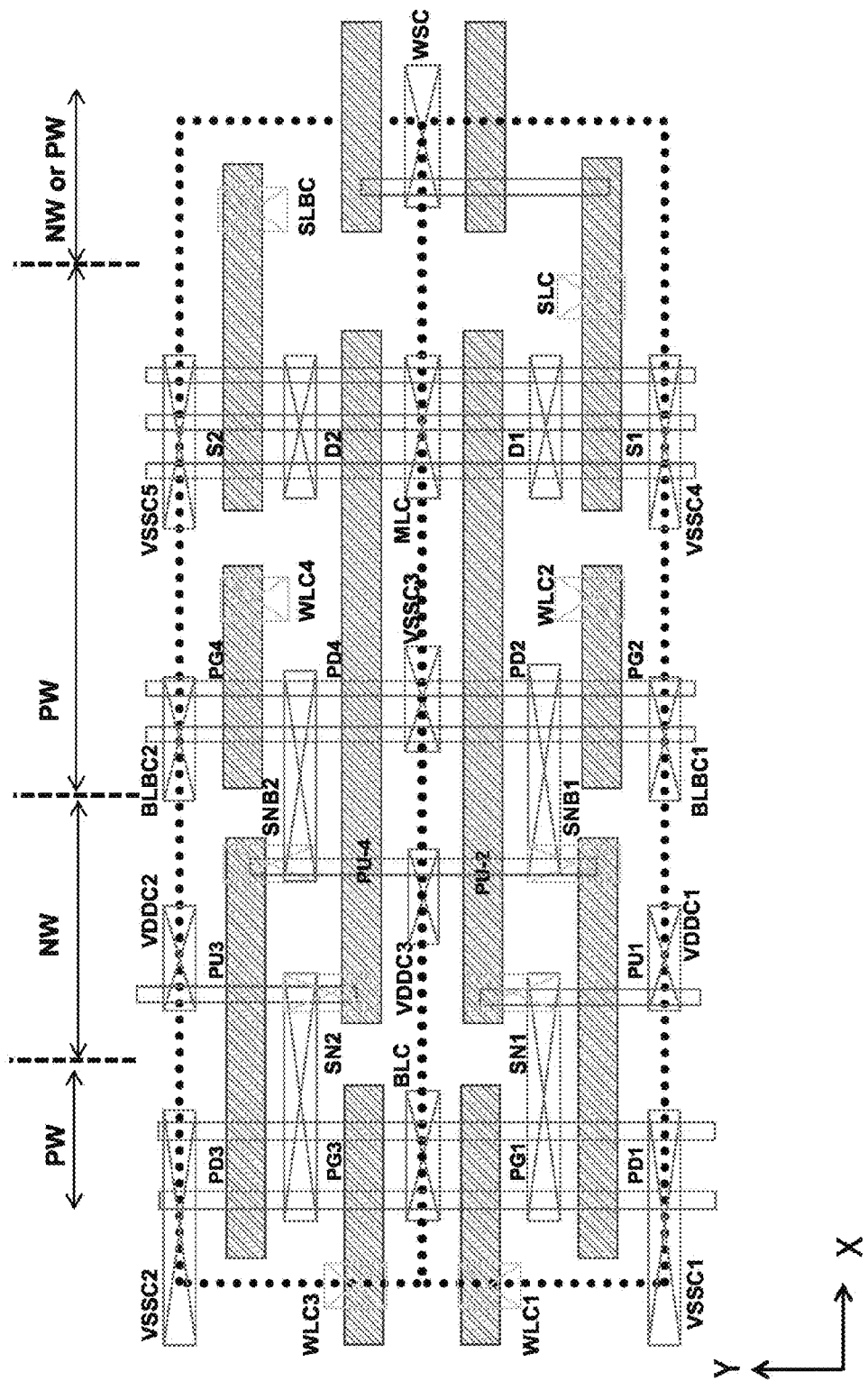
FIG. 8 is a third example cell layout for the cell in FIG. 1 according to an embodiment.

FIG. 8 illustrates a third example cell layout for the cell in FIG. 1 according to an embodiment. Although a layout is discussed corresponding to the cell in FIG. 1, a person of ordinary skill in the art will readily understand how to modify the layout in FIG. 8 to correspond to the cell in FIG. 2. The cell in FIG. 8 is a modification of the cell in FIG. 5. As previously discussed, the transistors may comprise one or more active areas. FIG. 8 is an example where transistors PD1, PG1, PG3, and PD3 comprise two active areas, and transistors PG2, PD2, PD4, and PG4 comprise two active areas. Further transistors S1 D1, D2, and S2 comprise three active areas.

Figure 9A:
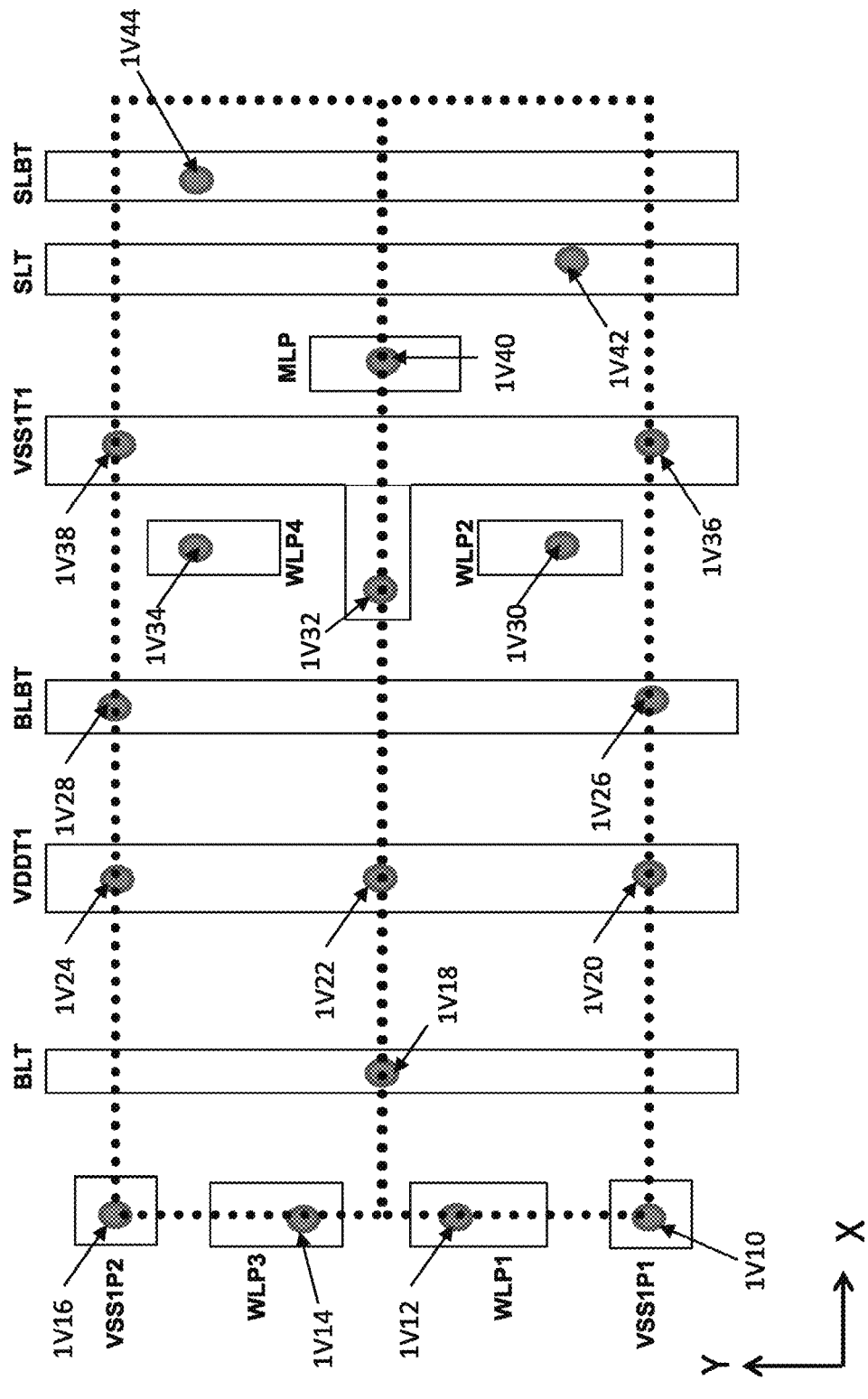
FIGS. 9A and 9B illustrate a first metallization layer and via layer and a second metallization layer and via layer, respectively, according to an embodiment.
Figure 9B:
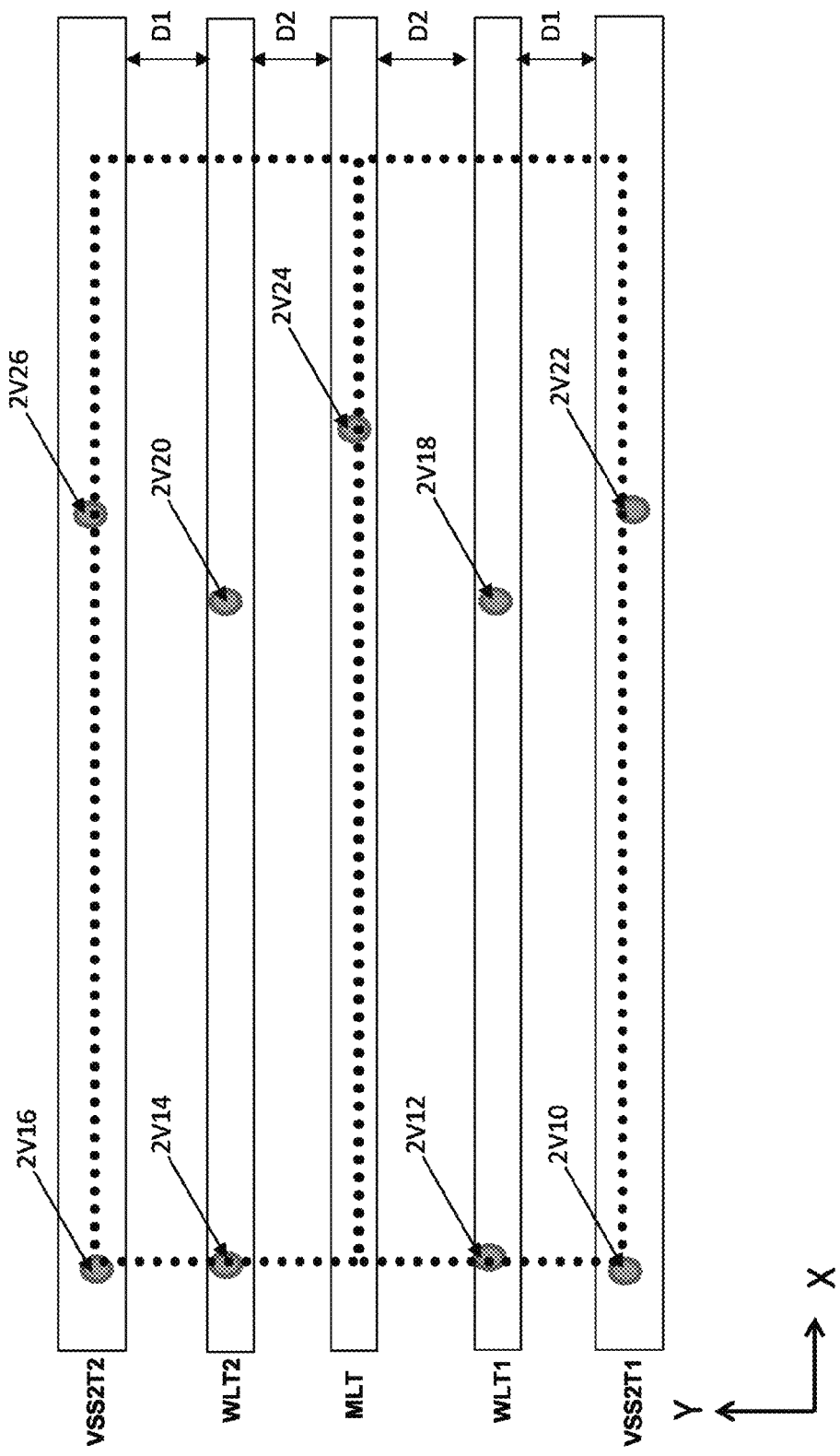

FIGS. 9A and 9B illustrate a first metallization layer and via layer and a second metallization layer and via layer, respectively, according to an embodiment. The first metallization layer and via layer in FIG. 9A may overlie the cell layout of FIG. 3, for example, and the second metallization layer and via layer in FIG. 9B overlies the first metallization layer in FIG. 9A. Although these layers are discussed as being adjacent metallization layers, a person of ordinary skill in the art will readily understand that other layers may intervene between the layers and any resulting modifications.

Referring to FIG. 9A, the first metallization layer comprises traces extending along a Y-direction. Particularly, the first metallization layer comprises a bit line trace BLT, a first power trace VDDT1, a complementary bit line trace BLBT, a first metallization first ground trace VSS1T1, a search line trace SLT, and a complementary search line trace SLBT. The first metallization first ground trace VSS1T1 comprises a projection extending along an X-direction between the two data latch portions of the cell. The first metallization layer further comprises first metallization first and second ground pads VSS1P1 and VSS1P2; first, second, third, and fourth word line pads WLP1, WLP2, WLP3, and WLP4; and a match line pad MLP. The first via layer comprises vias 1V10, 1V12, 1V14, 1V16, 1V18, 1V20, 1V22, 1V24, 1V26, 1V28, 1V30, 1V32, 1V34, 1V36, 1V38, 1V40, 1V42, and 1V44. Via 1V10 couples the pad VSS1P1 to contact VSSC1. Via 1V12 couples the pad WLP1 to contact WLC1. Via 1V14 couples the pad WLP3 to contact WLC3. Via 1V16 couples the pad VSS1P2 to contact VSSC2. Via 1V30 couples the pad WLP2 to contact WLC2. Via 1V34 couples the pad WLP4 to contact WLC4. Via 1V40 couples the pad MLP to contact MLC. Via 1V18 couples trace BLT to contact BLC. Vias 1V20, 1V22, and 1V24 couple trace VDDT1 to contacts VDDC1, VDDC3, and VDDC2, respectively. Vias 1V26 and 1V28 couple trace BLBT to contacts BLBC1 and BLBC2, respectively. Vias 1V32, 1V36, and 1V38 couple trace VSS1T1 to contacts VSSC3, VSSC4, and VSSC5, respectively. Via 1V32 couples the trace VSS1T1 at the projection that extends along the X-direction. Via 1V42 couples trace SLT to contact SLC. Via 1V44 couples trace SLBT to contact SLBC.

Referring to FIG. 9B, the second metallization layer comprises traces extending along an X-direction. Particularly, the second metallization layer comprises second metallization first and second ground traces VSS2T1 and VSS2T2, first and second world line traces WLT1 and WLT2, and a match line trace MLT. FIG. 9B illustrates a first distance D1 between a respective ground trace VSS2T1 and VSS2T2 and a respective word line trace WLT1 and WLT2, and illustrates a second distance D2 between a respective word line trace WLT1 and WLT2 and the match line trace MLT. The second distance D2 may be larger than the first distance D1. For example, the second distance D2 may be 30% larger than the first distance. The second via layer comprises vias 2V10, 2V12, 2V14, 2V16, 2V18, 2V20, 2V22, 2V24, and 2V26. Via 2V10 couples trace VSS2T1 to pad VSS1P1. Via 2V12 couples trace WLT1 to pad WLP1. Via 2V14 couples trace WLT2 to pad WLP3. Via 2V16 couples trace VSS2T2 to pad VSS1P2. Via 2V18 couples trace WLT1 to pad WLP2. Via 2V20 couples trace WLT2 to pad WLP4. Via 2V24 couples trace MLT to pad MLP. Via 2V22 couples trace VSS2T1 to trace VSS1T1, and via 2V26 couples trace VSS2T2 to trace VSS1T1. By having first metallization first ground trace VSS1T1 coupled to both second metallization first and second ground traces VSS2T1 and VSS2T2, the second metallization first and second ground traces VSS2T1 and VSS2T2 may be at substantially the same voltage, which may in turn increase robustness of a high power operation of the cell. These traces VSS1T1, VSS2T1, and VSS1T2 that are coupled together may form a ground mesh for the cell.

Figure 10A:
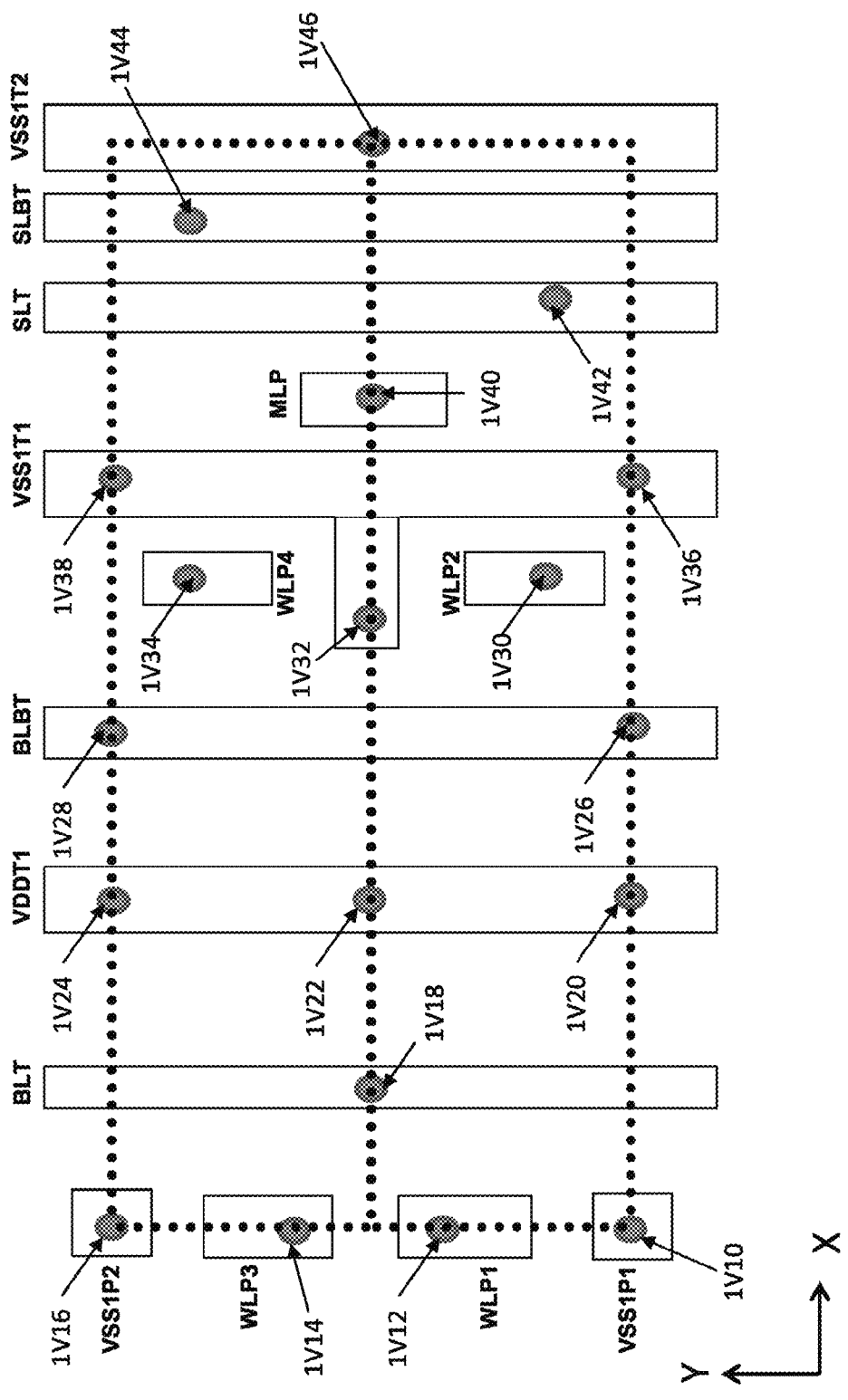
FIGS. 10A and 10B illustrate a first metallization layer and via layer and a second metallization layer and via layer, respectively, according to another embodiment.
Figure 10B:
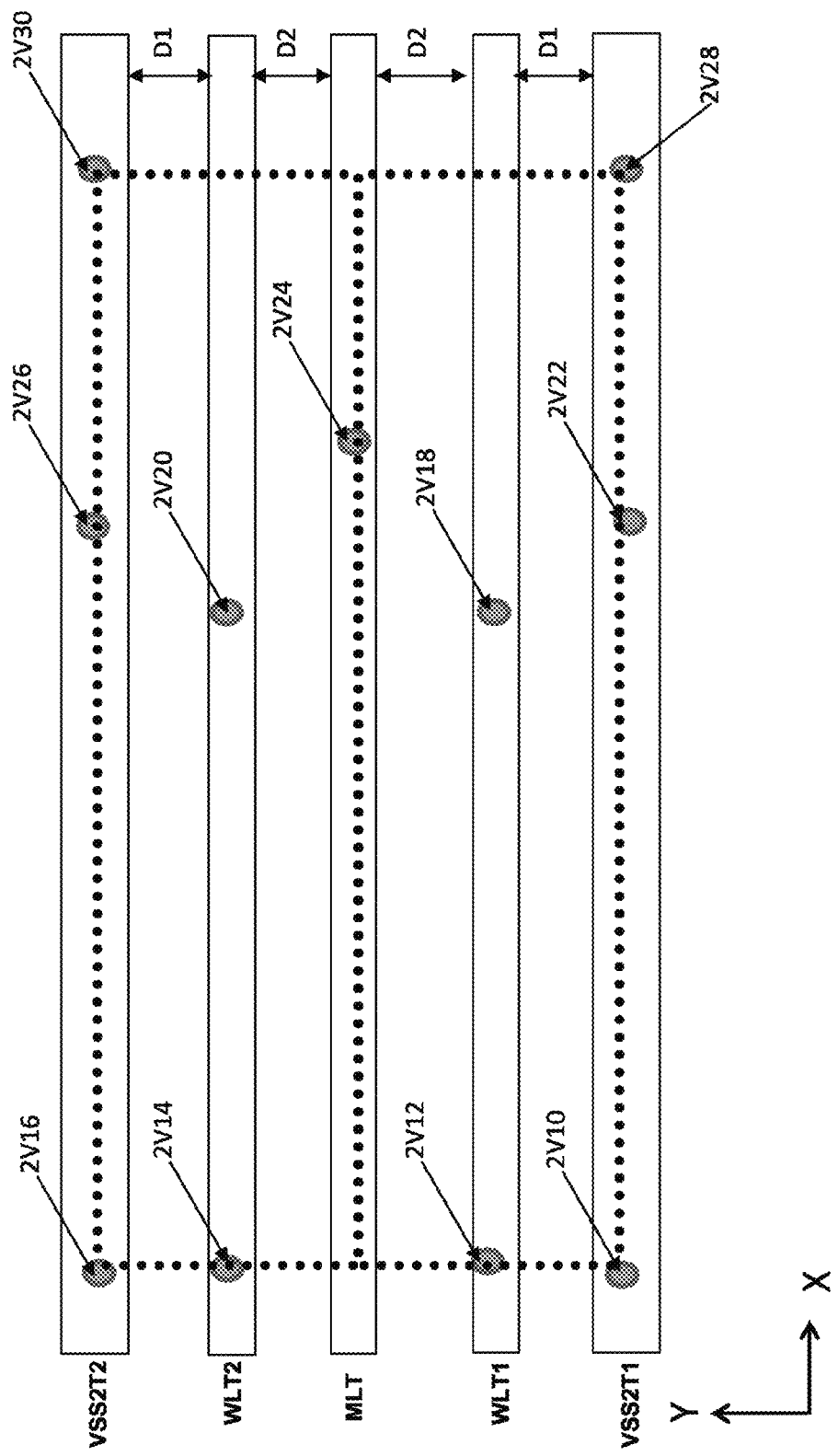

FIGS. 10A and 10B illustrate a first metallization layer and via layer and a second metallization layer and via layer, respectively, according to another embodiment. The first metallization layer and via layer in FIG. 10A may overlie the cell layout of FIG. 3, 5, or 8, and the second metallization layer and via layer in FIG. 10B overlies the first metallization layer in FIG. 10A. Although these layers are discussed as being adjacent metallization layers, a person of ordinary skill in the art will readily understand that other layers may intervene between the layers and any resulting modifications. The first metallization layer in FIG. 10A is the same as the first metallization layer in FIG. 9A with an additional first metallization second ground trace VSS1T2 extending in a Y-direction. The first via layer in FIG. 10A is the same as the first via layer in FIG. 9A with an optional via 1V46. The optional via 1V46 may be used to couple the trace VSS1T2 to contact WSC, such as when the cell layout of FIG. 5 or 8 and the p-doped well PW are used. In other embodiments, the via 1V46 may be omitted, such as when the cell layout of FIG. 3 is used and no well strap structure is present. The second metallization layer in FIG. 10B is the same as the second metallization in FIG. 9B. The second via layer in FIG. 10B is the same as the second via layer in FIG. 9B, except with vias 2V28 and 2V30. Via 2V28 couples the trace VSS2T1 to trace VSS1T2, and via 2V30 couples the trace VSS2T2 to trace VSS1T2. By having both first metallization first and second ground traces VSS1T1 and VSS1T2 coupled to both second metallization first and second ground traces VSS2T1 and VSS2T2, the second metallization first and second ground traces VSS2T1 and VSS2T2 may be at substantially the same voltage, which may in turn increase robustness of a high power operation of the cell. These traces VSS1T1, VSS1T2, VSS2T1, and VSS1T2 that are coupled together may form a ground mesh for the cell.

Figure 11A:
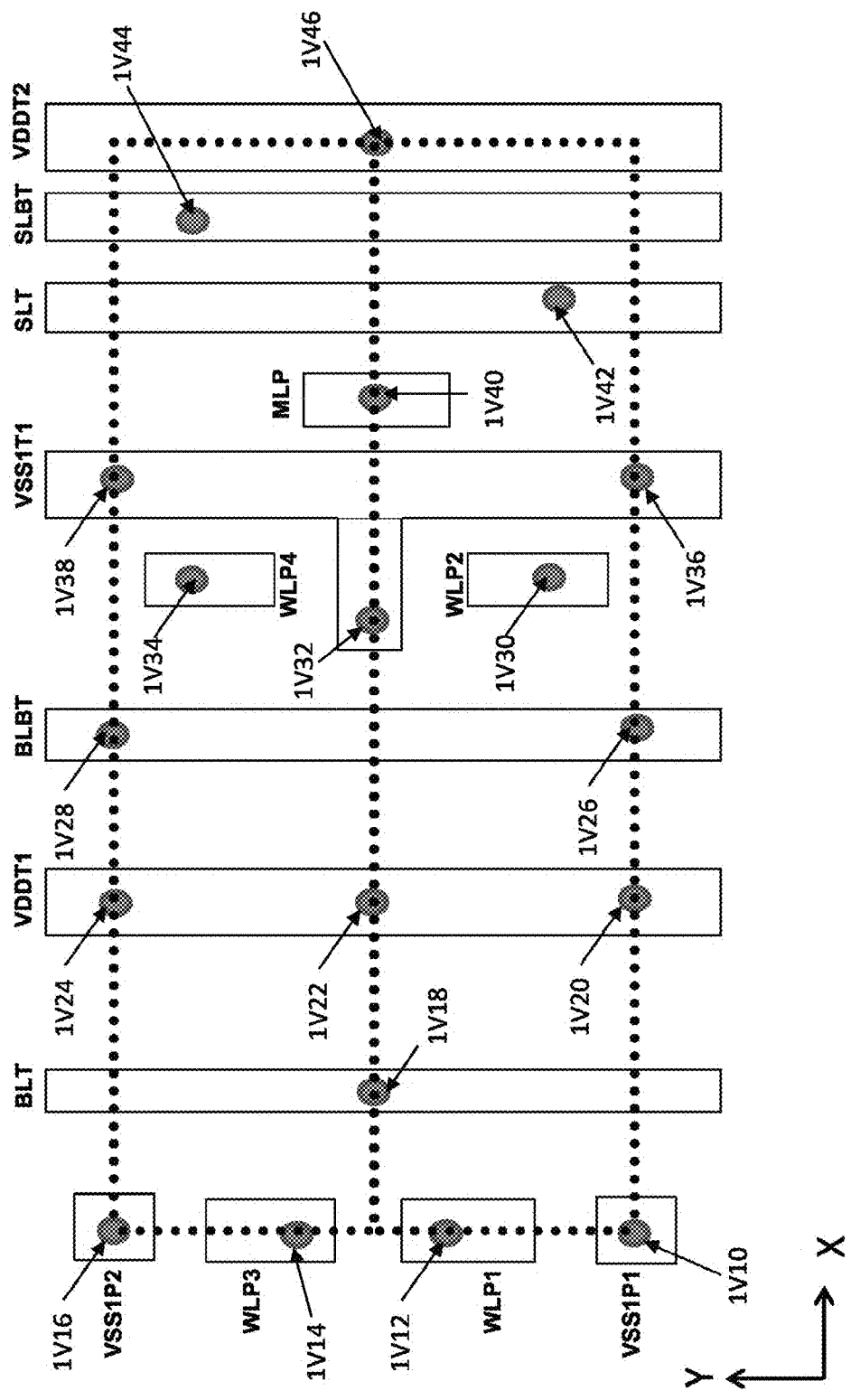

FIGS. 11A and 11B illustrate a first metallization layer and via layer and a second metallization layer and via layer, respectively, according to another embodiment. The first metallization layer and via layer in FIG. 11A may overlie the cell layout of FIG. 3, 5, or 8, and the second metallization layer and via layer in FIG. 11B overlies the first metallization layer in FIG. 11A. Although these layers are discussed as being adjacent metallization layers, a person of ordinary skill in the art will readily understand that other layers may intervene between the layers and any resulting modifications. The first metallization layer in FIG. 11A is the same as the first metallization layer in FIG. 9A with a second power trace VDDT2 extending in a Y-direction. The first via layer in FIG. 11A is the same as the first via layer in FIG. 9A with an optional via 1V46. The optional via 1V46 may be used to couple the trace VDDT2 to contact WSC, such as when the cell layout of FIG. 5 or 8 and the n-doped well NW are used. In other embodiments, the via 1V46 may be omitted, such as when the cell layout of FIG. 3 is used and no well strap structure is present. The second metallization layer and via layer in FIG. 11B are the same as the second metallization layer and via layer in FIG. 9B. By having first metallization first ground trace VSS1T1 coupled to both second metallization first and second ground traces VSS2T1 and VSS2T2, the second metallization first and second ground traces VSS2T1 and VSS2T2 may be at substantially the same voltage, which may in turn increase robustness of a high power operation of the cell. These traces VSS1T1, VSS2T1, and VSS1T2 that are coupled together may form a ground mesh for the cell.

Figure 12A:
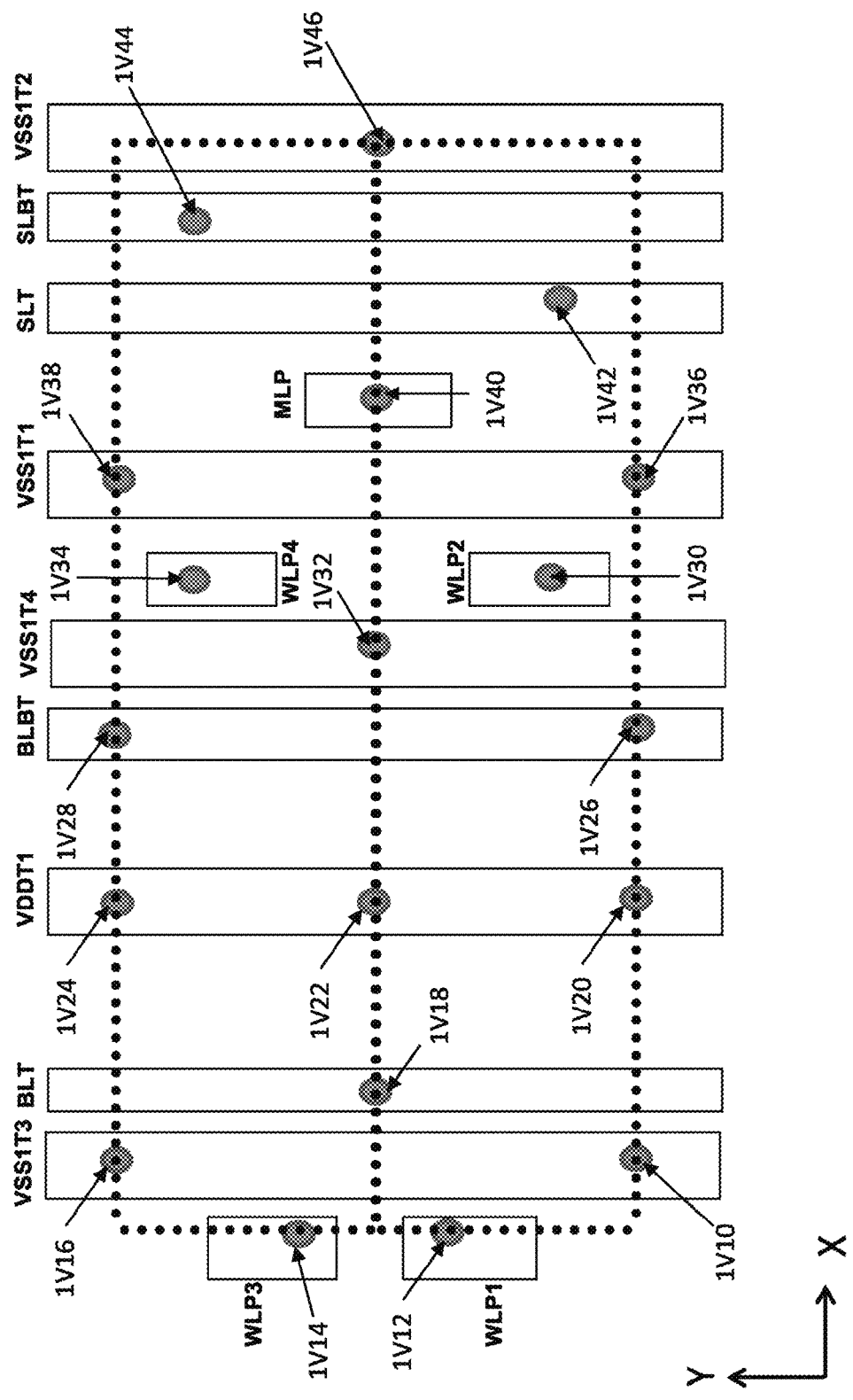
FIGS. 12A and 12B illustrate a first metallization layer and via layer and a second metallization layer and via layer, respectively, according to a further embodiment.
Figure 12B:
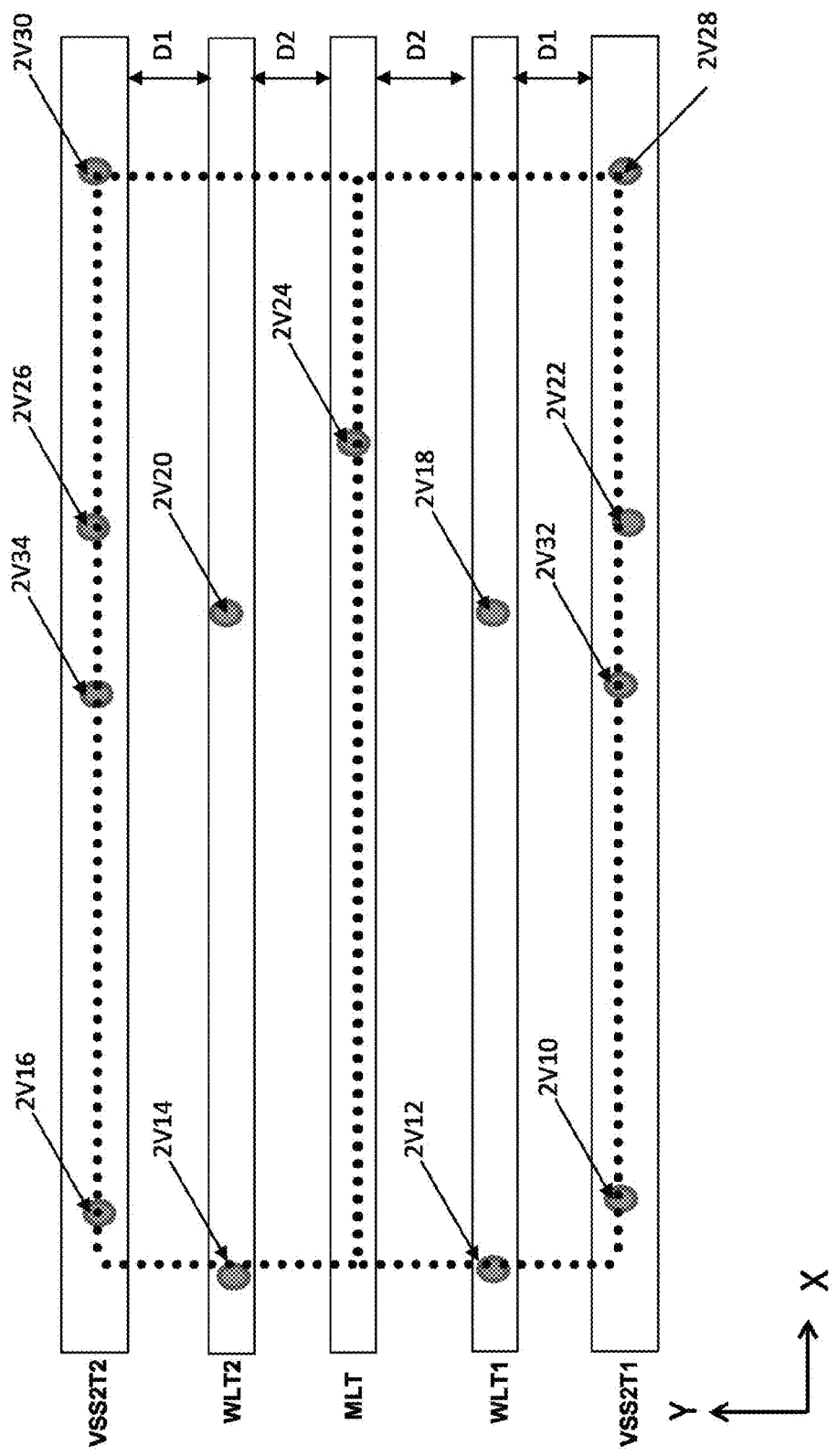

FIGS. 12A and 12B illustrate a first metallization layer and via layer and a second metallization layer and via layer, respectively, according to a further embodiment. The first metallization layer and via layer in FIG. 12A may overlie the cell layout of FIG. 3, 5, or 8, and the second metallization layer and via layer in FIG. 12B overlies the first metallization layer in FIG. 12A. Although these layers are discussed as being adjacent metallization layers, a person of ordinary skill in the art will readily understand that other layers may intervene between the layers and any resulting modifications.

The first metallization layer in FIG. 12A is similar to the first metallization layer in FIG. 9A. The first metallization layer in FIG. 12A further comprises first metallization second, third, and fourth ground traces VSS1T2, VSS1T3, and VSS1T4, respectively, each extending in a Y-direction. The first metallization first and second ground pads VSS1P1 and VSS1P2 are omitted in this embodiment. The first metallization first ground trace VSS1T1 does not have a projection in an X-direction in this example. The first via layer in FIG. 12A is similar to the first via layer in FIG. 9A. The first via layer in FIG. 12A includes an optional via 1V46. The optional via 1V46 may be used to couple the trace VSS1T2 to contact WSC, such as when the cell layout of FIG. 5 or 8 and a p-doped well PW are used. In other embodiments, the via 1V46 may be omitted, such as when the cell layout of FIG. 3 is used and no well strap structure is present. Other vias may be slightly moved and/or the components to which they are coupled may be altered. Via 1V10 couples the trace VSS1T3 to contact VSSC1. Via 1V16 couples the trace VSS1T3 to contact VSSC2. Via 1V32 couples the trace VSS1T4 to contact VSSC3.

The second metallization layer in FIG. 12B is the same as the second metallization in FIG. 9B. The second via layer in FIG. 12B is similar to the second via layer in FIG. 9B. The second via layer in FIG. 12B comprises vias 2V28, 2V30, 2V32, and 2V34, and vias 2V10 and 2V16 may be slightly moved. Via 2V28 couples the trace VSS2T1 to trace VSS1T2, and via 2V30 couples the trace VSS2T2 to trace VSS1T2. Via 2V10 couples trace VSS2T1 to trace VSS1T3, and via 2V16 couples trace VSS2T2 to trace VSS1T3. Via 2V32 couples trace VSS2T1 to trace VSS1T4, and via 2V34 couples trace VSS2T2 to trace VSS1T4. By having first metallization first, second, third, and fourth ground traces VSS1T1, VSS1T2, VSS1T3, and VSS1T4 coupled to both second metallization first and second ground traces VSS2T1 and VSS2T2, the second metallization first and second ground traces VSS2T1 and VSS2T2 may be at substantially the same voltage, which may in turn increase robustness of a high power operation of the cell. These traces VSS1T1, VSS1T2, VSS1T3, VSS1T4, VSS2T1, and VSS1T2 that are coupled together may form a ground mesh for the cell.

Figure 13A:
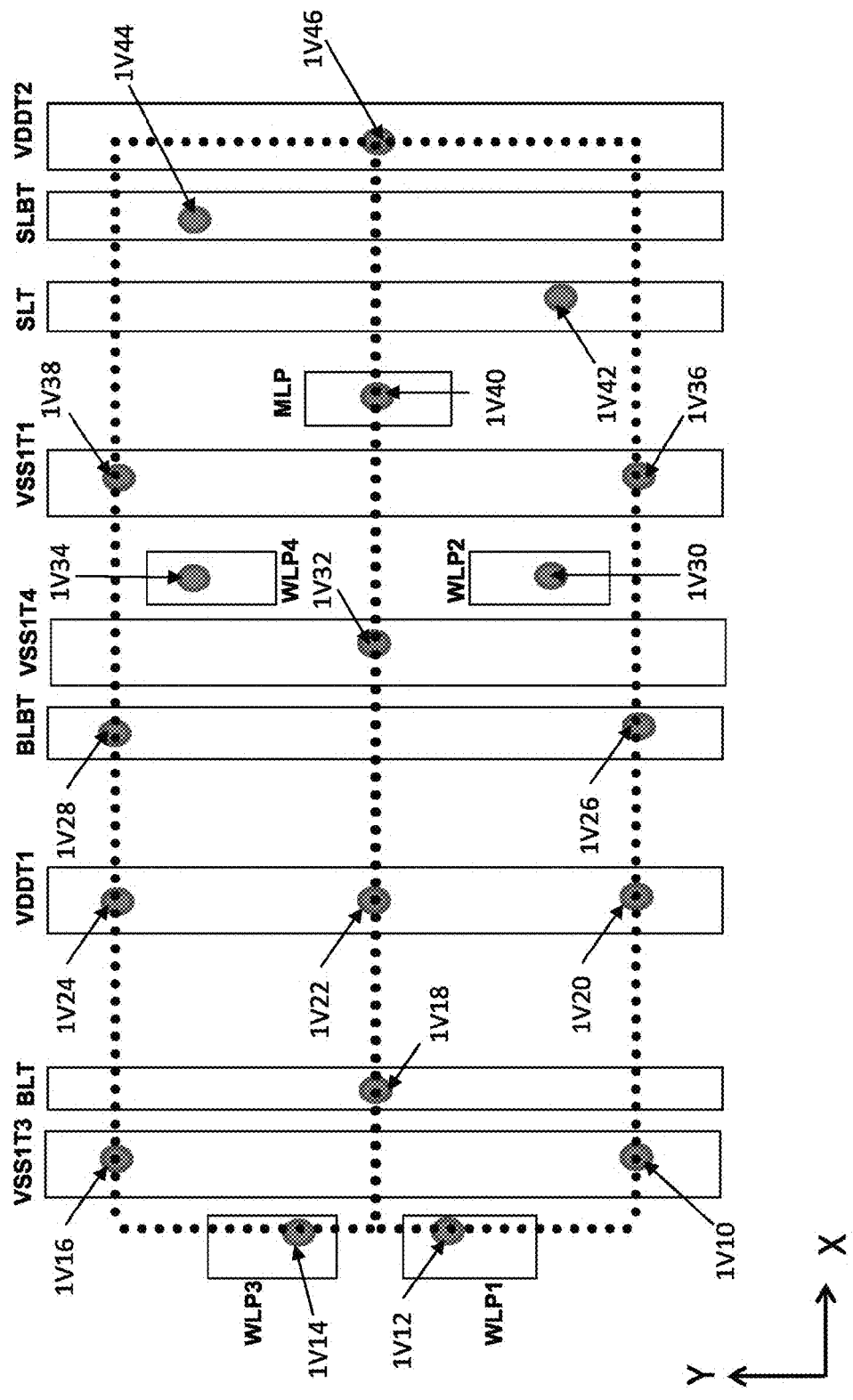

FIGS. 13A and 13B illustrate a first metallization layer and via layer and a second metallization layer and via layer, respectively, according to a further embodiment. The first metallization layer and via layer in FIG. 13A may overlie the cell layout of FIG. 3, 5, or 8, and the second metallization layer and via layer in FIG. 13B overlies the first metallization layer in FIG. 13A. Although these layers are discussed as being adjacent metallization layers, a person of ordinary skill in the art will readily understand that other layers may intervene between the layers and any resulting modifications.

The first metallization layer in FIG. 13A is similar to the first metallization layer in FIG. 12A. Instead of having a first metallization second ground trace VSS1T2, a second power trace VDDT2 extends along a Y-direction. The optional via 1V46 may be used to couple the trace VDDT2 to contact WSC, such as when the cell layout of FIG. 5 or 8 and an n-doped well NW are used. In other embodiments, the via 1V46 may be omitted, such as when the cell layout of FIG. 3 is used and no well strap structure is present. The second metallization layer in FIG. 13B is the same as the second metallization in FIG. 12B. The second via layer in FIG. 13B is similar to the second via layer in FIG. 12B, except there are no vias 2V28 and 2V30 to electrically couple traces VSS2T1 and VSS2T2 to trace VDDT2. By having first metallization first, third, and fourth ground traces VSS1T1, VSS1T3, and VSS1T4 coupled to both second metallization first and second ground traces VSS2T1 and VSS2T2, the second metallization first and second ground traces VSS2T1 and VSS2T2 may be at substantially the same voltage, which may in turn increase robustness of a high power operation of the cell. These traces VSS1T1, VSS1T3, VSS1T4, VSS2T1, and VSS1T2 that are coupled together may form a ground mesh for the cell.

Although various meshes have been discussed with respect to FIGS. 9A-B, 10A-B, 11A-B, 12A-B, and 13A-B with a ground mesh, the meshes may be modified to be power Vdd meshes. A person of ordinary skill in the art will readily understand modifications to the metallization layers and via layers discussed above to achieve power Vdd meshes. Further, although the metallization layers and via layers have been discussed with respect to the cell layouts of FIGS. 3, 5, and 8, which represent a layout of the circuit diagram of FIG. 1, a person having ordinary skill in the art will readily understand modifications to the metallization layers and via layers when a cell layout representing the layout of the circuit diagram of FIG. 2 is used.

Figure 14:
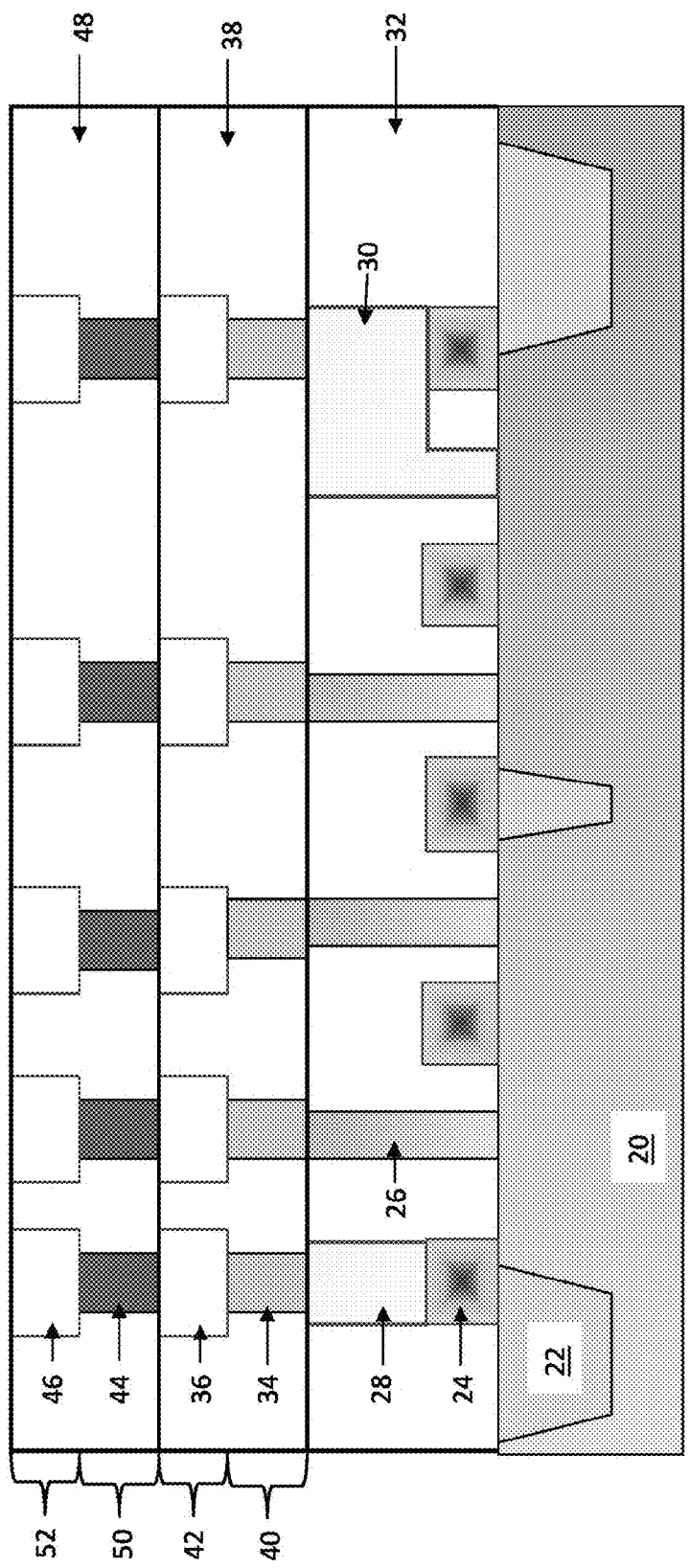
FIG. 14 is a representation of various layers and components that may be present in a structure according to an embodiment.

FIG. 14 is a representation of various layers and components that may be present in a structure according to an embodiment. The structure comprises a substrate 20, which may be a semiconductor substrate, like a bulk substrate, semiconductor on insulator (SOI) substrate, or the like. The substrate 20 comprises isolation regions 22, such as Shallow Trench Isolations (STIs), used to define active areas of the substrate 20. Gate structures 24, such as a conductive material (like doped polysilicon, a metal, a silicide, the like or a combination thereof) over a gate dielectric layer, are on the substrate 20. Substrate contacts 26 may be formed through a first dielectric layer 32, such as an inter-layer dielectric (ILD), to the substrate 20. Gate contacts 28 may be formed through the first dielectric layer 32 to a gate structure 24. A butted contact 30 may be formed through the first dielectric layer 32 to a gate structure 24 and the substrate 20. A second dielectric layer 38, such as an inter-metal dielectric (IMD), overlies the first dielectric layer 32. First vias 34 and first metal patterns 36 are in the second dielectric layer 38. The first vias 34 are in a first via layer 40, which may correspond to the first via layer of FIGS. 9A, 10A, 11A, 12A, and 13A. The first metal patterns 36 are in a first metallization layer, which may correspond to the first metallization layer of FIGS. 9A, 10A, 11A, 12A, and 13A. A third dielectric layer 48, such as an IMD, overlies the second dielectric layer 38. Second vias 44 and second metal patterns 46 are in the third dielectric layer 48. The second vias 44 are in a second via layer 50, which may correspond to the second via layer of FIGS. 9B, 10B, 11B, 12B, and 13B. The second metal patterns 46 are in a second metallization layer, which may correspond to the second metallization layer of FIGS. 9B, 10B, 11B, 12B, and 13B. FIG. 14 generally illustrates various components, and a person of ordinary skill in the art will readily understand that modifications may be made to this structure.

Embodiments may have advantages. For example, a soft error rate (SER) may be reduced. By providing a cell layout with a well arrangement, the SER may be reduced. Latch-up performance may be increased. By providing a cell layout with another well arrangement, the latch-up performance may be increased. By providing cells with a single active area, such as a single fin active area, for respective transistors, a cell density may be increased. Further, robustness of the cell may be increased, for example, by using a ground/power metal routing mesh, such as in high power applications.

According to an embodiment, a cell structure includes a first p-doped well in a substrate, a second p-doped well in the substrate, a first n-doped well in the substrate, a first group of transistors, a second group of transistors, and a well strap structure. The first n-doped well is disposed between the first p-doped well and the second p-doped well. Respective first ones of the first group of transistors form a first latch, and respective second ones of the first group of transistors form a second latch. The first group of transistors has respective active areas in the first p-doped well in the substrate, the first n-doped well in the substrate, or the second p-doped well in the substrate. The second group of transistors form a cascaded device electrically coupled to the first latch and the second latch. The second group of transistors has an active area in the second p-doped well in the substrate. The well strap structure comprises an active area electrically coupled to a power node or a ground node.

According to another embodiment, a cell structure includes a first data latch comprising a first group of transistors having active areas in a substrate; a second data latch comprising a second group of transistors having active areas in the substrate; a search port comprising a third group of transistors having an active area in the substrate; and a well strap structure having an active area in the substrate. A first metallization layer is over the substrate and comprises a first ground trace and a well strap trace each extending in a first direction. The active area of the well strap structure is electrically coupled to the well strap trace. A second metallization layer is over the substrate and comprises a second ground trace and a third ground trace each extending in a second direction. The first direction intersects the second direction. The second ground trace and the third ground trace are electrically coupled to the first ground trace.

According to a further embodiment, a cell structure includes a first data latch comprising a first group of transistors, a second data latch comprising a second group of transistors, and a search port comprising a third group of transistors. Each transistor of the first group of transistors and the second group of transistors has a single fin active area in a substrate. The third group of transistors has a fin active area in the substrate. A first metallization layer is over the substrate and comprises a first ground trace and a well strap trace each extending in a first direction. A second metallization layer is over the substrate and comprises a second ground trace and a third ground trace each extending in a second direction. The first direction intersects the second direction. The second ground trace and the third ground trace are electrically coupled to the first ground trace.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cell structure comprising:
   a content addressable memory structure located at least partially within a substrate;
   a well strap structure having an active area in the substrate;
   a first metallization layer over the substrate and comprising a first ground trace and a well strap trace each extending in a first direction, the active area of the well strap structure being electrically coupled to the well strap trace; and
   a second metallization layer over the substrate and comprising a second ground trace and a third ground trace each extending in a second direction, the first direction intersecting the second direction, the second ground trace and the third ground trace being electrically coupled to the first ground trace.

2. The cell structure of claim 1, wherein the first ground trace comprises a first portion with a longitudinal axis and a second portion extending from the first portion.

3. The cell structure of claim 2, wherein the second portion extends away from the first portion at a right angle.

4. The cell structure of claim 1, wherein the second metallization layer further comprises a word line trace adjacent to the third ground trace and a match line trace adjacent to the word line trace.

5. The cell structure of claim 4, wherein a distance between the match line trace and the word line trace is larger than a distance between the word line trace and the third ground trace.

6. The cell structure of claim 1, wherein the first ground trace is rectangular in shape.

7. A cell structure comprising:
   a first group of transistors, a first set of the first group of transistors forming a first latch, a second set of the first group of transistors forming a second latch, wherein each transistor within the first group of transistors has a FinFET structure;
   a second group of transistors forming a cascaded device electrically connected to the first latch and the second latch, wherein each transistor within the second group of transistors has a multiple FinFET structure;
   a first metallization layer overlying the first group of transistors and the second group of transistors, the first metallization layer comprising:

a first ground trace extending over the first group of transistors;

a first power trace extending over the first group of transistors; and a search line extending over the first group of transistors; and a second metallization layer overlying the first metallization layer, the second metallization layer comprising a second ground trace and a third ground trace, wherein the first ground trace is electrically connected with both the second ground trace and the third ground trace.

8. The cell structure of claim 7, further comprising a well strap structure located adjacent to an edge of the cell structure.

9. The cell structure of claim 8, wherein the well strap structure is electrically connected to a fourth ground trace in the first metallization layer.

10. The cell structure of claim 8, wherein the well strap structure is electrically connected to a second power trace in the first metallization layer.

11. The cell structure of claim 7, further comprising a word line trace adjacent to the second ground trace in the second metallization layer.

12. The cell structure of claim 11, further comprising a match line trace adjacent to the word line trace in the second metallization layer.

13. The cell structure of claim 12, wherein the match line trace is separated from the word line trace by a first distance and wherein the word line trace is separated from the second ground trace by a second distance less than the first distance.

14. The cell structure of claim 7, wherein the first ground trace has a "T" shape.

15. A cell structure comprising:
a first cell comprising:
a first data latch;
a second data latch; and
a cascaded device connected to both the first data latch and the second data latch;
a second cell adjacent to the first cell;
a well strap structure shared between the first cell and the second cell, wherein the well strap structure comprises an active area electrically coupled to a power node or a ground node;
a first metallization layer over the substrate and comprising a first ground trace and a well strap trace each extending in a first direction, the active area of the well strap structure being electrically coupled to the well strap trace; and
a second metallization layer over the substrate and comprising a second ground trace and a third ground trace each extending in a second direction, the first direction intersecting the second direction, the second ground trace and the third ground trace being electrically coupled to the first ground trace.

16. The cell structure of claim 15, wherein the first data latch comprises six devices, the second data latch comprises six devices, and the cascaded device comprises four devices.

17. The cell structure of claim 15, wherein the cascaded device comprises:
a first search gate transistor, the first search gate transistor comprising a first source region electrically connected to a ground;
a second search gate transistor, the second search gate transistor comprising a second source region electrically connected to the ground;
a first data gate transistor connected to the first search gate transistor, the first data gate transistor comprising a first drain region connected to a match line; and
a second data gate transistor connected to the second search gate transistor, the second data gate transistor comprising a second drain region connected to the match line.

18. The cell structure of claim 17, wherein the first search gate transistor is connected to a search line, the second search gate transistor is connected to a complementary search line, the first data gate transistor is connected to the first data latch, and the second data gate transistor is connected to the second data latch.

19. The cell structure of claim 15, wherein the cascaded device comprises:
a first search gate transistor, the first search gate transistor comprising a first drain region electrically connected to a match line;
a second search gate transistor, the second search gate transistor comprising a second drain region electrically connected to the match line;
a first data gate transistor connected to the first search gate transistor, the first data gate transistor comprising a first source region connected to a ground; and
a second data gate transistor connected to the second search gate transistor, the second data gate transistor comprising a second source region connected to the ground.

20. The cell structure of claim 19, wherein the first search gate transistor is connected to a search line, the second search gate transistor is connected to a complementary search line, the first data gate transistor is connected to the first data latch, and the second data gate transistor is connected to the second data latch.

* * * * *